(12) United States Patent
Linnen et al.

(10) Patent No.: US 12,276,706 B2
(45) Date of Patent: Apr. 15, 2025

(54) MULTIPLE STAGE FUSE CIRCUITRY FOR COUNTING FAILURE EVENTS

(71) Applicant: Western Digital Technologies, Inc., San Jose, CA (US)

(72) Inventors: Daniel Joseph Linnen, Limestone, TN (US); Kirubakaran Periyannan, Saratoga, CA (US); Elliott Peter Rill, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 108 days.

(21) Appl. No.: 18/222,873

(22) Filed: Jul. 17, 2023

(65) Prior Publication Data

US 2024/0361401 A1 Oct. 31, 2024

Related U.S. Application Data

(60) Provisional application No. 63/461,898, filed on Apr. 25, 2023.

(51) Int. Cl.
| | | |
|---|---|---|
| *G01R 31/50* | (2020.01) | |
| *H02H 3/033* | (2006.01) | |
| *H03K 21/08* | (2006.01) | |

(52) U.S. Cl.
CPC ............. *G01R 31/50* (2020.01); *H02H 3/033* (2013.01); *H03K 21/08* (2013.01)

(58) Field of Classification Search
None
See application file for complete search history.

(56) References Cited

U.S. PATENT DOCUMENTS

| | | |
|---|---|---|
| 8,194,489 B2 | 6/2012 | Bentley et al. |
| 9,791,482 B1 | 10/2017 | Carpenter, Jr. et al. |

(Continued)

FOREIGN PATENT DOCUMENTS

| | | |
|---|---|---|
| CN | 101165888 A | 4/2008 |
| CN | 109493909 A | 3/2019 |

OTHER PUBLICATIONS

Panguloori, Rakesh, "Basics of eFuses", Texas Instruments Incorporated; Dec. 2016; https://www.ti.com/lit/an/slva862a/slva862a.pdf?ts=1681978096436; 14 pages.

(Continued)

*Primary Examiner* — Cassandra F Cox
(74) *Attorney, Agent, or Firm* — LOZA & LOZA, LLP; Gabriel Fitch

(57) ABSTRACT

The disclosure relates in some aspects to an apparatus that includes stages of a failure event counting circuit including an $N^{th}$ stage where N refers to an arbitrary stage of the stages of the failure event counting circuit. The $N^{th}$ stage may include an $N^{th}$ fuse trigger circuit configured to receive an event detector signal indicative of a failure event, an $N^{th}$ electronic fuse configured to disconnect a circuit path between a voltage source and a ground in response to the event detector signal, and an $N^{th}$ delay circuit coupled to the $N^{th}$ e-fuse and configured to cause a time delay for activating a subsequent stage of the failure event counting circuit in response to the $N^{th}$ e-fuse disconnecting. In this aspect, each of the stages of the failure event counting circuit may be configured to use the respective e-fuse to record a discrete failure event.

19 Claims, 18 Drawing Sheets

(56) References Cited

U.S. PATENT DOCUMENTS

| | | |
|---|---|---|
| 9,984,762 B1 | 5/2018 | Seshasayee et al. |
| 10,666,039 B2 | 5/2020 | La Rosa et al. |
| 11,600,347 B2 * | 3/2023 | Dozaka ................ G11C 17/08 |
| 11,682,895 B2 * | 6/2023 | Dukaric ................ H01H 71/32 |
| | | 318/400.08 |
| 2022/0326284 A1 | 10/2022 | Kim et al. |

OTHER PUBLICATIONS

"Clarifying the Status of LED Indicators in Fuse Terminals", Electronic Products & Technology (EP&T); Jun. 25, 2012; https://www.ept.ca/2012/06/clarifying-the-status-of-led-indicators-in-fuse-terminals/; 4 pages.

* cited by examiner

MULTIPLE STAGE FUSE CIRCUITRY FOR COUNTING FAILURE EVENTS

CROSS-REFERENCE TO RELATED APPLICATIONS

This application claims priority to and the benefit of U.S. Provisional Patent Application No. 63/461,898, filed on Apr. 25, 2023 entitled, "MULTIPLE STAGE FUSE CIRCUITRY FOR COUNTING FAILURE EVENTS." the entire content of which is incorporated herein by reference.

FIELD

The disclosure relates, in some embodiments, to an apparatus for performing failure analysis. More specifically, but not exclusively, the disclosure relates to an apparatus with multiple stages including electronic fuses for counting failure events.

INTRODUCTION

An electronic device may experience an electrical failure event that may be unacceptable for proper operations of the electronic device. For example, failure events may be caused by electrostatic discharge (ESD) events may involve, for example, a sudden flow of electricity between two electrically charged objects. When an ESD event occurs, an accumulation of charge from the sudden flow of electricity may generate an ESD voltage that may peak at a relatively high level, which may cause damage to an electronic circuit. More than a few failure events occurring at the electronic device may indicate that the electronic device and/or surrounding environments may need to be examined. Hence, it is desirable to monitor occurrences of the failure events.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides an apparatus for performing failure analysis that includes a plurality of stages of a failure event counting circuit including an $N^{th}$ stage where N refers to an arbitrary stage of the plurality of stages of the failure event counting circuit. The $N^{th}$ stage may include an $N^{th}$ fuse trigger circuit configured to receive an input signal indicative of a failure event, an $N^{th}$ electronic fuse (e-fuse) configured to disconnect a circuit path between a voltage source and a ground in response to the input signal, and an $N^{th}$ delay circuit coupled to the $N^{th}$ e-fuse and configured to cause a time delay for activating a subsequent stage of the failure event counting circuit in response to the $N^{th}$ e-fuse disconnecting. In this aspect, each of the stages of the failure event counting circuit is configured to use the respective e-fuse to record a discrete failure event.

Another embodiment of the disclosure provides an apparatus for performing failure analysis that includes a plurality of stages of a failure event counting circuit including an $N^{th}$ stage where N refers to an arbitrary stage of the plurality of stages of the failure event counting circuit and a final stage of the failure event counting circuit connected to a last stage of the plurality of stages of the failure event counting circuit. The Na stage may include an $N^{th}$ fuse trigger circuit configured to receive an input signal indicative of a failure event, an $N^{th}$ electronic fuse (e-fuse) configured to disconnect a circuit path between a voltage source and a ground in response to the input signal, and an $N^{th}$ delay circuit coupled to the $N^{th}$ e-fuse and configured to cause a time delay for activating a subsequent stage of the failure event counting circuit in response to the $N^{th}$ e-fuse disconnecting. The final stage may include a final fuse trigger circuit to receive a final event detector signal indicative of a final failure event, and a final e-fuse configured to disconnect in response to the final event detector signal. In this aspect, each of the stages of the failure event counting circuit is configured to use the respective e-fuse to record a discrete failure event.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

In electronic devices, failure events may indicate errors or faults in operations within the electronic devices or in specific components within the devices. For example, a failure event may involve an "over-voltage" with an unusually high voltage (e.g., high voltage above a certain voltage threshold). For example, a failure event may include an electrostatic discharge (ESD). An ESD may be defined as a sudden flow of electricity between two electrically charged objects caused by, for example, contact, an electrical short, or dielectric breakdown between the objects.

Figure 1:
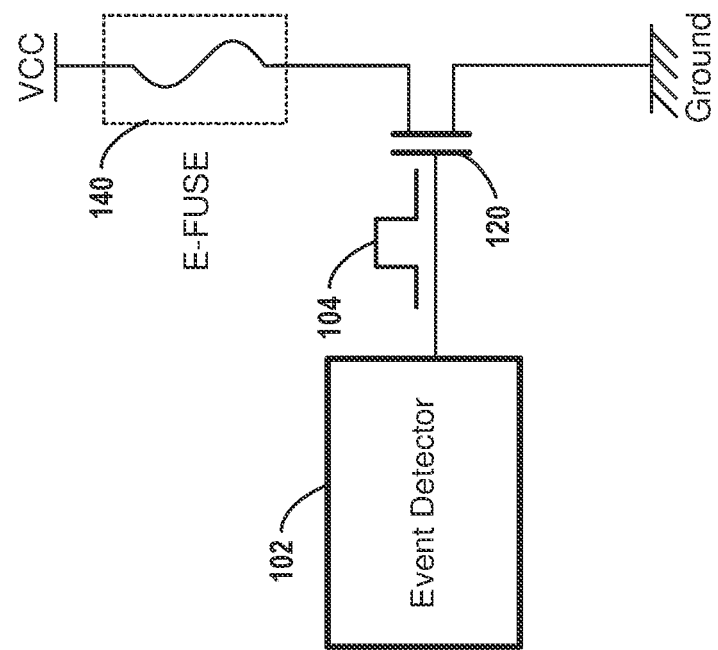
FIG. 1 shows a diagram illustrating an example failure event indication circuit.

FIG. 1 shows a diagram 100 illustrating an example failure event indication circuit. An event detector 102 may be configured to detect a failure event. When the event detector 102 detects a failure event, the event detector 102 may generate an event detector signal 104 where a high portion (e.g., a high voltage level for a preselected duration) indicates the failure event. The event detector signal 104 may be a digital signal. If a failure event is absent (i.e., no failure has been detected), the event detector 102 may generate the output signal 104 at a low level (e.g., low voltage level).

As shown in FIG. 1, for example, when the event detector 102 detects a failure event, the event detector 102 may generate the event detector signal 104 with a high portion that indicates the failure event. The event detector 102 may be connected to a transistor 120 configured to receive the event detector signal 104. For example, a gate terminal of the transistor 120 may be connected to the event detector 102 to receive the event detector signal 104. One non-gate terminal (e.g., source terminal) of the transistor 120 may be connected to one end of an electronic fuse (e-fuse) 140, where the other end of the electronic fuse is connected to a supply voltage (e.g., voltage common collector (VCC)). The other non-gate terminal (e.g., drain terminal) of the transistor 120 may be connected to ground.

When the event detector 102 detects a failure event and thus generates the output signal 104 with the high portion, the transistor 120 switches (e.g., switches on) to allow current to flow between the source and drain terminals. As a result, the current flows from VCC directly to ground and the e-fuse 140 disconnects, effectively in response to the event detector signal 104 with the high portion. When the gate of the transistor 120 is held low (e.g., when there is no fault condition indicated by the event detector 102), the transistor 120 is switched off such that little or no current flows between the source and drain terminals. The e-fuse 140 disconnecting may indicate that there has been a failure event. Hence, monitoring whether the e-fuse 140 is connected or disconnected may provide information as to whether there has been a failure event.

The e-fuse 140 may not be reconnected or reset on its own after disconnecting (e.g., fusing or blowing). Once the e-fuse 140 disconnects, any additional failure events cannot be indicated or recorded because there are no more e-fuses to disconnect. Therefore, the example failure event indication circuit is unable to detect more than one failure event. However, for a failure analysis in electronic devices, such as those that include a solid state drive (SDD), a hard disk drive (HDD) and other electronic systems, it may be helpful to know how many times the electronic devices were subjected to unacceptable failure events. For example, a high number of unacceptable failure events may indicate a serious issue that needs to be examined (e.g., including diagnosing which component within an electronic device might be causing the failure events). Therefore, an apparatus to effectively record the number of failure events having occurred in such an electronic device is desired.

According to some aspects of the disclosure, an apparatus for performing failure analysis may include a failure event counting circuit with multiple stages. For example, the failure event counting circuit may include up to M stages, which includes a first stage through an $M^{th}$ stage, where M is a positive integer greater than 1. Where N is any positive number within the M number of stages of the failure event counting circuit, an $N^{th}$ stage of the multiple stages may include an $N^{th}$ fuse trigger component/circuit configured to receive an event detector signal indicative of a failure event and control a current to an $N^{th}$ e-fuse based on the event detector signal, where the $N^{th}$ e-fuse is configured to disconnect a circuit path between a voltage source and a ground in response to the current (e.g., switched based on the event detector signal). The $N^{th}$ stage of the multiple stages of the failure event counting circuit may further include an $N^{th}$ delay component/circuit coupled to the $N^{th}$ e-fuse and configured to generate a time delay for an output that becomes an input signal (e.g., $(N+1)^{th}$ stage activation signal) to a subsequent stage (e.g., $(N+1)^{th}$ stage) of the failure event counting circuit in response to the $N^{th}$ e-fuse disconnecting. Due to the time delay signal provided by the $N^{th}$ delay component/circuit, one failure event that causes disconnection of the $N^{th}$ e-fuse of the $N^{th}$ delay component/circuit may not also disconnect the next e-fuse (e.g., the $(N+1)^{th}$ e-fuse) of the next stage (e.g., the $(N+1)^{th}$ stage) of the failure event counting circuit. As such, each of the stages of the failure event counting circuit may be configured to use their respective e-fuse to record a discrete failure event. For example, when a failure event causes an e-fuse of one stage of the failure event counting circuit to disconnect, an e-fuse of a subsequent stage of the failure event counting circuit may not be affected by this failure event. Instead, in this example, the e-fuse of the subsequent stage may be disconnected by a subsequent failure event. Hence, the apparatus according to some aspects of the disclosure may detect and memorialize multiple failure events by employing multiple stages respectively including multiple e-fuses. In some aspects, the $N^{th}$ fuse trigger component/circuit may include a transistor configured to control a current to an $N^{th}$ e-fuse based on the event detector signal.

In an aspect, the failure event counting circuit may further include a final stage connected to the last regular stage of its multiple stages. For example, the failure event counting circuit may include M stages (where each of the M stages includes a fuse trigger component, an e-fuse, and a delay component) and may further include a final stage that includes a final fuse trigger component and a final e-fuse, where the final stage is connected to the $M^{th}$ stage of the failure event counting circuit. The final stage may include a final fuse trigger component to receive both a final event detector signal from the last stage (e.g., $M^{th}$ stage) and an event detection signal, and a final e-fuse where the final fuse trigger component is configured to provide a current of sufficient magnitude to cause the final e-fuse to disconnect, all in response to assertion of the final activation signal and the event detection signal.

Figure 2:
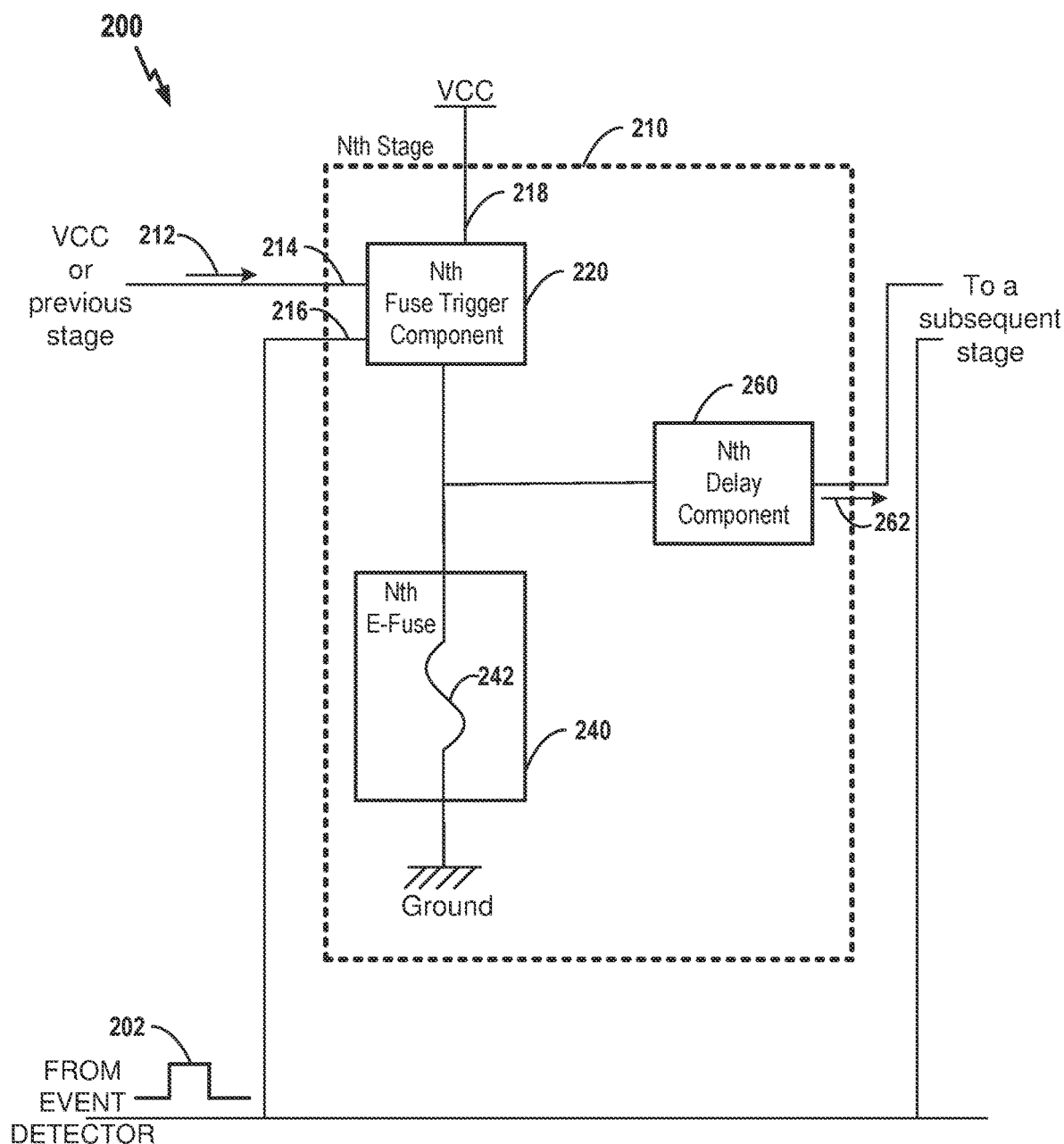
FIG. 2 is an example diagram illustrating an $N^{th}$ stage of the multiple stages of a failure event counting circuit, according to some aspects.

FIG. 2 is an example diagram 200 illustrating an exemplary $N^{th}$ stage 210 of the multiple stages of the failure event counting circuit, according to some aspects. In an example, the failure event counting circuit may include multiple $N^{th}$ stages 210 connected in series. As shown in FIG. 2, the $N^{th}$ stage 210 of the failure event counting circuit may include an $N^{th}$ fuse trigger component 220 configured to receive an event detector signal 202 indicative of a failure event via an event detection signal line 216. In an aspect, the $N^{th}$ fuse trigger component 220 may be further configured to receive an $N^{th}$ stage activation signal 212 at an activation input 214, where the $N^{th}$ stage activation signal 212 is effectively used for activating the $N^{th}$ stage 210 for failure event counting.

The event detector signal 202 may be provided by an event detector (not shown in FIG. 2 but see 102 in FIG. 1) configured to detect a failure event. When the event detector 102 detects a failure event, it generates an event detector signal such as the event detector signal 202 with a high portion indicating the failure event. As used herein, when a signal is said to have a "high portion" indicating a failure event, this indicates that the signal is meant to be interpreted as a conventional active high signal in a digital circuit.

The $N^{th}$ stage 210 may further include an $N^{th}$ e-fuse 240 configured to disconnect a circuit path (e.g., fusable link) 242 between a voltage source and a ground in response to a (high) current provided by the fuse trigger component 220 is response to assertion of the event detector signal 202 and the $N^{th}$ stage activation signal 212. As discussed above, when the event detector detects a failure event and thus provides the event detector signal 204 with a high portion to the $N^{th}$ fuse trigger component 220 and the $N^{th}$ stage activation signal 212 is asserted, the $N^{th}$ e-fuse 240 connected to the $N^{th}$ fuse trigger component 220 may disconnect the path to ground in response to the event detector signal 204 with the high portion.

The $N^{th}$ stage 210 may further include an $N^{th}$ delay component 260 coupled to the $N^{th}$ e-fuse 240 and configured to cause a time delay for activating a subsequent stage of the failure event counting circuit in response to the $N^{th}$ e-fuse 240 disconnecting. In an aspect, an input of the $N^{th}$ delay component 260 may be connected to the output of the $N^{th}$ fuse trigger component 220 as well as the $N^{th}$ e-fuse 240. In an aspect, in response to the $N^{th}$ e-fuse 240 disconnecting, the $N^{th}$ delay component 260 may generate a time delayed signal (e.g., a subsequent stage activation signal) 262 for activating the subsequent stage of the failure event counting circuit.

As discussed above, the $N^{th}$ fuse trigger component 220 may be configured to receive an $N^{th}$ stage activation signal 212 for activating the $N^{th}$ stage 210. For example, the $N^{th}$ stage 210 may not be activated for failure event counting, and thus unable to trigger e-fuse 240, unless the $N^{th}$ stage activation signal 212 is provided to the $N^{th}$ fuse trigger component 220. In some aspects, the $N^{th}$ fuse trigger component 220 may be configured to allow the current to flow directly from VCC at a fuse input line 218 to the $N^{th}$ e-fuse 240 in response to the event detector signal and based on the $N^{th}$ stage activation signal 212. For example, the $N^{th}$ fuse trigger component 220 may be configured to allow the current (e.g., a current of sufficient magnitude to blow the $N^{th}$ e-fuse, which may be referred to as a fusing current) to flow directly from VCC at the fuse input line 218 to the $N^{th}$ e-fuse 240 in response to the high portion (e.g., high voltage level) of the event detector signal 202 to disconnect the $N^{th}$ e-fuse 240 when the $N^{th}$ stage 210 is activated by the $N^{th}$ stage activation signal 212. Without the $N^{th}$ stage activation signal 212 activating the $N^{th}$ stage 210, the $N^{th}$ fuse trigger component 220 may allow little or no current to flow from VCC at the fuse input line 218 to the $N^{th}$ e-fuse 240 and the $N^{th}$ e-fuse 240 may not disconnect. In an example, if the activation input 214 receives a low signal or no signal, the event detector signal 202 alone may not be sufficient to cause the $N^{th}$ fuse trigger component 220 to allow the current to flow directly from VCC at the fuse input line 218 to the $N^{th}$ e-fuse 240. On the other hand, if the activation input 214 receives the $N^{th}$ stage activation signal 212 that is a high signal, the $N^{th}$ fuse trigger component 220 may allow the current to flow directly from VCC at 218 to the $N^{th}$ e-fuse 240 to cause the $N^{th}$ e-fuse 240 to disconnect in response to the high portion of the event detector signal 202 indicating the failure event.

In some aspects, if the $N^{th}$ stage 210 is a first stage of the failure event counting circuit, the $N^{th}$ stage activation signal 212 may be from a voltage source (e.g., VCC), and thereby constantly asserted. In this case, the first stage of the failure event may always be activated for failure event counting. In some aspects, if the $N^{th}$ stage 210 is not the first stage, then the activation signal 212 may be provided from a previous stage (e.g., $(N-1)^{th}$ stage) of the failure event counting circuit, after an e-fuse of the previous stage has disconnected. In this aspect, after an e-fuse of the previous stage has disconnected, the $N^{th}$ stage 210 may be activated for counting the next failure event.

In some aspects, the $N^{th}$ delay component 260 may be configured to cause the time delay to generate a subsequent stage activation signal 262 for activating the subsequent stage after the time delay in response to the $N^{th}$ e-fuse 240 disconnecting. Due to the time delay, the subsequent stage is not activated at the same time as the failure event that causes the $N^{th}$ e-fuse 240 to disconnect, and thus the e-fuse of the subsequent stage is not disconnected due to the same failure event.

In an aspect, the time delay applied by the $N^{th}$ delay component 260 may be associated with a type of the event, the type of event characterizing at least one of a shape of the event detector signal or a magnitude of the event detector signal. In an aspect, the time delay generated by the $N^{th}$ delay component 260 is configured to be greater than an expected pulse duration of the failure event (e.g., event detector signal). By setting the time delay to be greater than the expected high pulse duration of the failure event, the high pulse racing of the subsequent stage activation signal 262 into the next stage may be avoided.

In one example, the time delay may be set to count only certain types of events. For example, to count only events having a particular high pulse duration or longer in the event detector signal, the time delay may be set to the particular high pulse duration. In another example, to count all events, the time delay may be set to a shorter duration, such as a duration of a shortest expected high pulse duration.

In an aspect, the time delay may be longer than a time it takes the $N^{th}$ e-fuse 240 to disconnect. For example, if the time delay is shorter than the time it takes the $N^{th}$ e-fuse 240 to disconnect, the $N^{th}$ e-fuse 240 may not properly disconnect even with the event detector signal 202 indicating the failure event.

In an aspect, the time delay applied by the $N^{th}$ delay component 260 may be adjustable. The $N^{th}$ delay component 260 may be configured to adjust the time delay. For example, the multiple stages in the apparatus may have a first set of stages having delay components applying a first time delay and a second set of stages having delay components applying a second time delay shorter than the first time delay. As such, the first set of stages may detect events with a longer high pulse duration, while the second set of stages may detect events with a shorter high pulse duration.

In some examples, the $N^{th}$ delay component 260 may be implemented using a standard RC type delay circuit. In one such example, the $N^{th}$ delay component 260 may include a resistor and a capacitor arranged in series, where an input into the $N^{th}$ delay component 260 is connected to a resistor at a node not shared with the capacitor, and a common node shared by the resistor and the capacitor is connected to an output from the $N^{th}$ delay component 260, and a node of the capacitor not shared with the resistor is connected to the ground. The time delay applied by the $N^{th}$ delay component 260 may be determined by the product of the resistance of the resistor and the capacitance of the capacitor. Therefore, by selecting particular values for the resistance and the capacitance, the time delay may be set for the $N^{th}$ delay component 260. For example, a time delay greater than the pulse duration of the event detector signal may be set by selecting particular values for the resistance of the resistor and the capacitance of the capacitor that result in such a time delay for the $N^{th}$ delay component 260. In one example, an additional resistor may be connected to the common node shared by the resistor and the capacitor at one end and connected to the ground at the other end, where the additional resistor is connected in parallel to the capacitor. The additional resistor may have a strong resistance, such as a resistance greater than 100 kiloohms, so as to function as a weak pull-down that keeps the circuit components stabilized during certain events such as power-ups.

Figure 3:
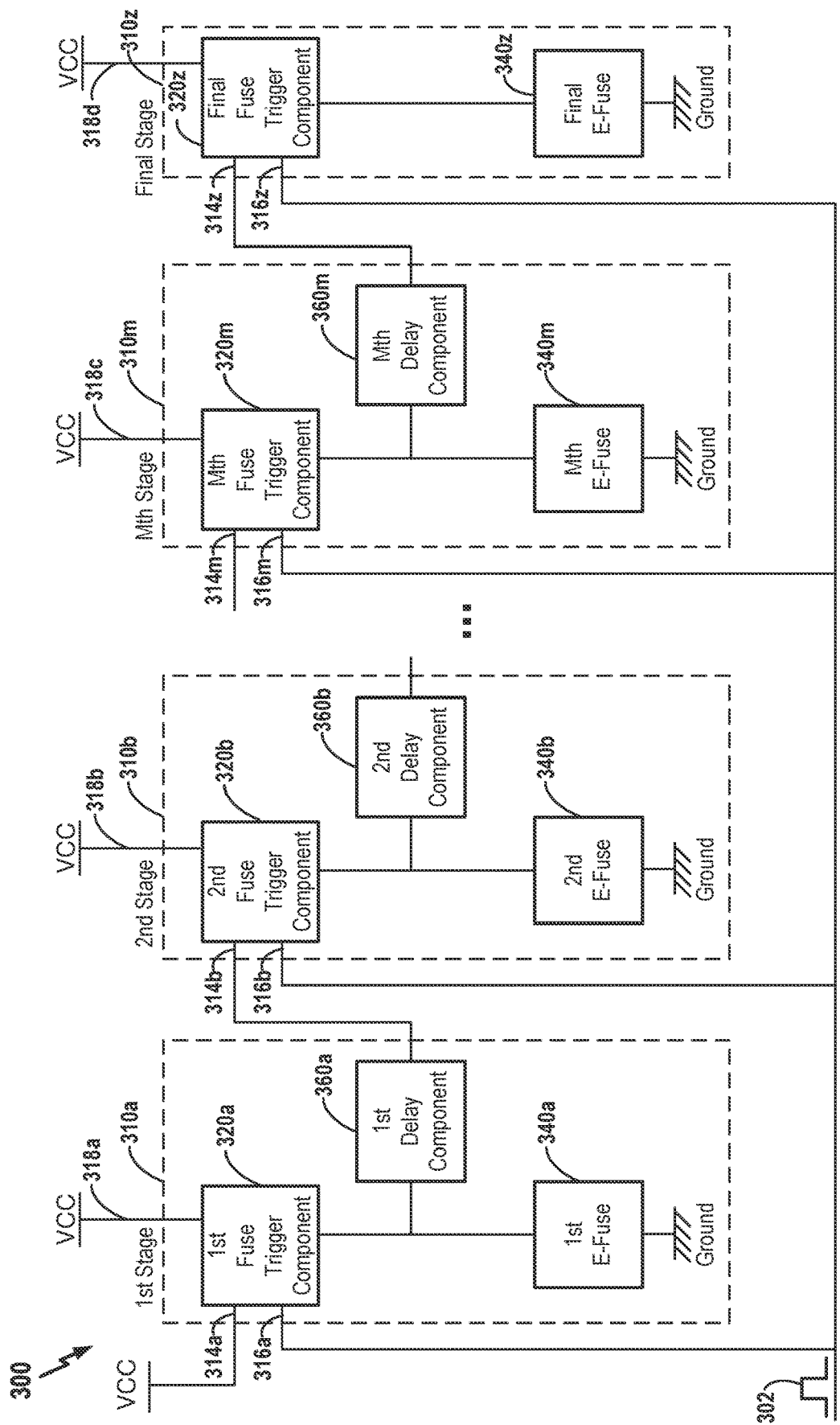
FIG. 3 is an example diagram illustrating an apparatus for performing failure analysis having multiple stages of the failure event counting circuit, according to some aspects.

FIG. 3 is an example diagram 300 illustrating an apparatus for performing failure analysis having multiple stages of the failure event counting circuit, according to some aspects. As shown in FIG. 3, the apparatus for performing failure analysis may include M stages of the failure event counting circuit, where M is a positive integer. In particular, a first stage 310a of the M stages may include a first fuse trigger component 320a, a first e-fuse 340a, and a first delay component 360a. A second stage 310b of the M stages may include a second fuse trigger component 320b, a second e-fuse 340b, and a second delay component 360b. An $M^{th}$ stage 310m of the M stages may include an $M^{th}$ fuse trigger component 320m, an $M^{th}$ e-fuse 340m, and an $M^{th}$ delay component 360m. The first stage 310a, the second stage 310b, and the $M^{th}$ stage 310m each may have components similar to the components of the $N^{th}$ stage 210 of FIG. 2, and thus the details of the components of the first stage 310a, the second stage 310b, and the $M^{th}$ stage 310m are omitted for brevity.

The apparatus for performing failure analysis may further include a final stage 310z of the failure event counting circuit connected to a last stage of the plurality of stages of the failure event counting circuit. The final stage 310z of the failure event counting circuit may include a final fuse trigger component 320z and a final e-fuse 340z. The final stage 310z does not have an output to any subsequent component, and thus may not include a delay component. The final fuse trigger component 320z may be configured to receive a final event detector signal indicative of a final failure event. The final e-fuse 340z may be configured to disconnect in response to the final event detector signal.

An event detector may be connected to a fuse trigger component of each stage. Hence, when the event detector detects a failure event, an event detector signal 302 indicative of the failure event may be provided to all of the M stages (e.g., via event detection inputs 316a, 316b, ... 316m) and the final stage (e.g., via a final event detection input 316z). Further, the first fuse trigger component 320a, a second fuse trigger component 320b, an $M^{th}$ fuse trigger component 320m, and the final fuse trigger component 320z may be connected to VCC via the first fuse input line 318a, a second fuse input line 318b, an $M^{th}$ fuse input line 318m, and the final fuse input line 318z, respectively. Thus, a fuse trigger component of a particular stage includes a component (e.g., transistor) that may switch on to allow the current from VCC to flow to an e-fuse of the particular stage, in response to an event detector signal. However, unless a stage is activated by a stage activation signal activating the fuse trigger component of the stage, the fuse trigger component may not allow the current to flow directly from VCC at a fuse input line to an e-fuse of the stage. For example, except for the first stage 310a, a default initial setting for the other stages may be a deactivated state. For example, as a default setting, the second stage 310b may be deactivated with the second activation input 314b inputting a low signal to the second fuse trigger component 320b, the $M^{th}$ stage 310m may be deactivated with the $M^{th}$ activation input 314m inputting a low signal to the $M^{th}$ fuse trigger component 320m, and the final stage 310z may be deactivated with the final activation input 314z inputting a low signal to the final fuse trigger component 320z. On the other hand, for example, the first stage 310a may always be activated with a first stage activation signal being a high signal (e.g., via VCC) at the activation input 314a, activating the first fuse trigger component 320a. Hence, the event detector signal 302 indicating a failure event by a high signal may cause the first fuse trigger component 320a to allow the current flow directly from the VCC at a first fuse input line 318a to the first e-fuse 340a, which causes the first e-fuse 340a to disconnect, without causing the other fuse trigger components to affect the other e-fuses of the other stages. Once the first e-fuse 340a disconnects, an output node of the first fuse trigger component 320a provides a high signal that can be used to activate a subsequent stage. However, because the event detector signal 302 already caused the first e-fuse 340a to disconnect, it is desired that the high signal portion of the event detector signal 302 should not affect the subsequent stages. To prevent the event detector signal 302 from causing the second e-fuse 340b to disconnect (e.g., in response to a first failure event), the first delay component 360a provides a time delay for the high signal from VCC at the first fuse input line 318a to thereby generate a second stage activation signal that is provided to the second activation input 314b. Due to the time delay, when the second fuse trigger component 320b receives the second stage activation signal to activate the second stage 310b, the high signal for the first failure event as provided by the event detector signal 302 has already passed, and thus the high signal of the event detector signal 302 does not affect the second fuse trigger component 320b. Instead, when a second event detector signal (not shown but similar to event detector signal/pulse 302 received at a later time) indicative of a second failure event arrives after the time delay in the second stage activation signal 314b by the first delay component 360a, the second event detector signal may cause the second e-fuse 340b to allow the current to flow directly from VCC at the second fuse input line 318b to the second e-fuse 340b, causing the second e-fuse 340b to disconnect.

Figure 4:
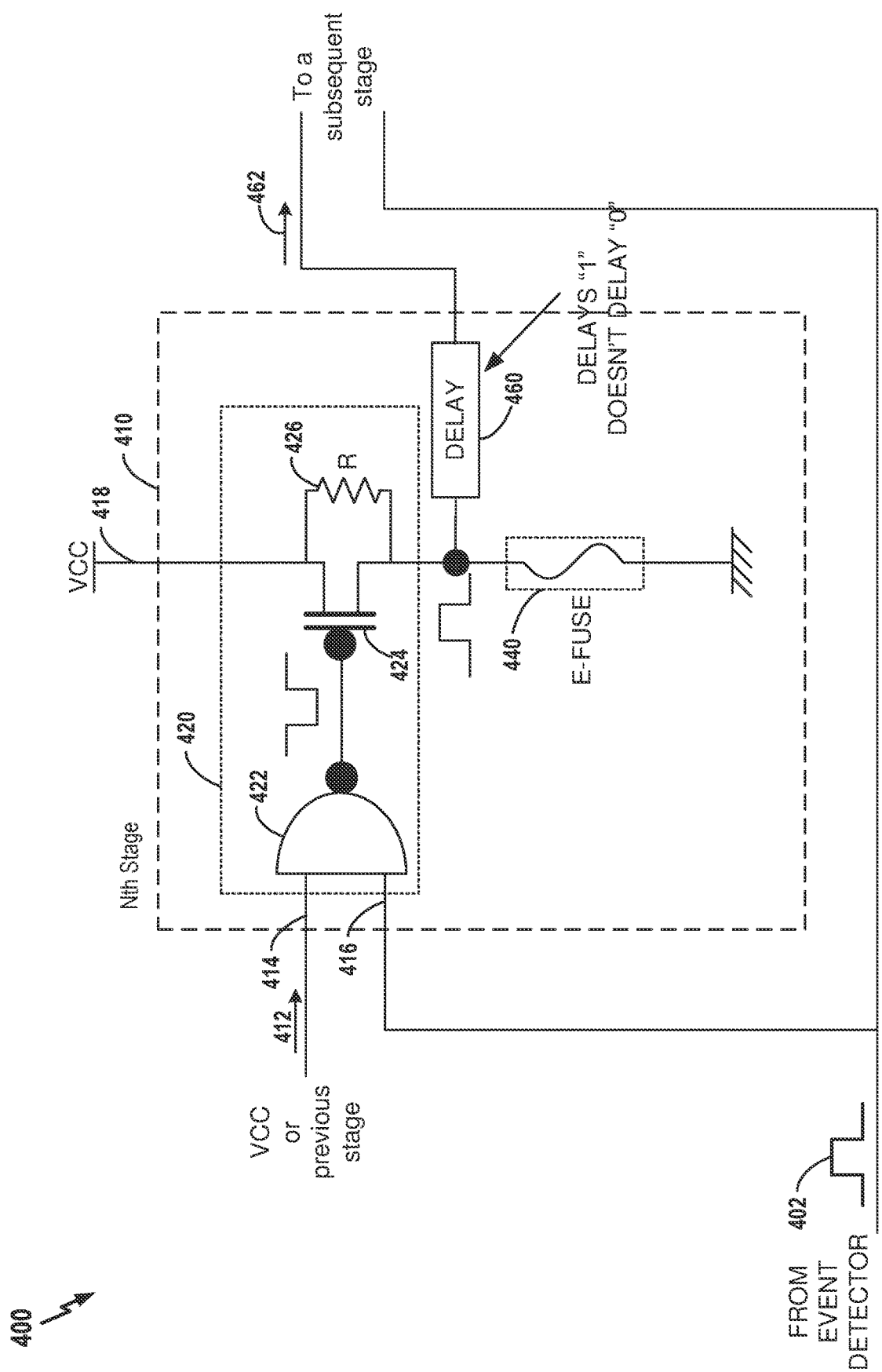
FIG. 4 is an example diagram illustrating an $N^{th}$ stage of the multiple stages of the failure event counting circuit utilizing a first fuse trigger sub-circuit, according to some aspects.

FIG. 4 is an example diagram 400 illustrating an $N^{th}$ stage 410 of the multiple stages of the failure event counting circuit utilizing a first fuse trigger sub-circuit, according to some aspects. The $N^{th}$ stage 410 may include an $N^{th}$ fuse trigger component/circuit 420, an $N^{th}$ e-fuse 440, and an $N^{th}$ delay component 460. For example, the $N^{th}$ stage 410 shown in FIG. 4 may be an example of the $N^{th}$ stage 210 shown in FIG. 2. Hence, the $N^{th}$ fuse trigger component 420, the $N^{th}$ e-fuse 440, and the $N^{th}$ delay component 460 of the $N^{th}$ stage 410 shown in FIG. 4 may be at least similar to the $N^{th}$ fuse trigger component 220, the $N^{th}$ e-fuse 240, and the $N^{th}$ delay component 260 of the $N^{th}$ stage 210 shown in FIG. 2, which are explained in detail above in reference to FIG. 2.

As shown in FIG. 4, the $N^{th}$ fuse trigger component 420 includes a NAND gate 422 that has an activation input 414 to receive an $N^{th}$ stage activation signal and an event detection input 416 to receive an event detector signal 402 from a failure event detector. When a NAND gate is used, an $N^{th}$ stage activation signal 412 may activate the $N^{th}$ stage 410 when the $N^{th}$ stage activation signal 412 is a high signal (e.g., 1). Hence, in some aspects, if the Net stage 410 is a first stage of the failure event counting circuit, the activation input 414 may be connected to a VCC and thus the $N^{th}$ stage activation signal 412 may be a high signal (e.g., 1). Therefore, the first stage of the failure event may always be activated for failure event counting. In some aspects, if the $N^{th}$ stage 410 is not the first stage, then the activation signal 412 may be provided from a previous stage (e.g., $(N-1)^{th}$ stage) of the failure event counting circuit, after an e-fuse of the previous stage has disconnected.

The output of the NAND gate 422 is connected to a gate of an p-channel metal-oxide-semiconductor (PMOS) transistor 424. A source of the PMOS transistor 424 is connected to a VCC via a fuse input line 418 and a drain of the PMOS transistor 424 is connected to one end of the $N^{th}$ e-fuse 440, which is connected to a ground at the other end. The source and the drain of the PMOS transistor 424 are connected to each other via a resistor 426. The drain of the PMOS transistor 424 may be an output of the $N^{th}$ fuse trigger component 420, which is connected to the $N^{th}$ e-fuse 440 and the $N^{th}$ delay component 460.

When the NAND gate 422 is used in the $N^{th}$ fuse trigger component 420, a high signal in the event detector signal 402 may indicate a failure event. Hence, the event detector signal 402 provided by the event detector may have a high signal to indicate a failure event. If there is no signal or a low signal to the activation input 414, the NAND gate 422 may receive the event detector signal 402 and only output a high signal to a gate of the PMOS transistor 424, which switches off the PMOS transistor 424. With the PMOS transistor 424 switched off, the current from VCC via the fuse input line 418 flows to the resistor 426, which allows little or no current into the e-fuse 440, thereby failing to disconnect the e-fuse 440. On the other hand, if the $N^{th}$ stage 410 is activated by an $N^{th}$ stage activation signal (e.g., high signal) provided to the activation input 414, then the NAND gate 422 may receive the event detector signal 402 and output an inverted version of the event detector signal 402 with a high signal or a low signal to the gate of the PMOS transistor 424. When the PMOS transistor 424 receives the low signal (of the inverted version of the event detector signal 402) at its gate, the PMOS transistor 424 may switch on to allow the current (e.g., a fusing current) from the VCC via the fuse input line 418 to flow directly to the $N^{th}$ e-fuse 440 via the drain of the PMOS transistor 424, which causes the $N^{th}$ e-fuse 440 to disconnect. Hence, for example, the high signal of the event detector signal 402 may cause the $N^{th}$ e-fuse 440 to disconnect, if the $N^{th}$ stage 410 is activated by an $N^{th}$ stage activation signal.

Prior to the $N^{th}$ e-fuse 440 disconnecting, the input to the $N^{th}$ delay component/circuit 460 may be a low signal (e.g., 0). After the $N^{th}$ e-fuse 440 disconnects, the resistor 426 may hold the value of the signal at the output of the $N^{th}$ fuse trigger component 420 and the input of the $N^{th}$ delay component 460 to a high signal (e.g., 1). The $N^{th}$ delay component 460 causes a time delay to this high signal, and thus outputs a subsequent stage activation signal 462 that is a high signal, after the time delay. As discussed above, the time delay is used to ensure that the event detector signal 402 causing the $N^{th}$ e-fuse 440 to disconnect does not cause an e-fuse of the subsequent stage to disconnect at the same time. The subsequent stage activation signal is sent to a subsequent stage to activate the subsequent stage.

Figure 5:
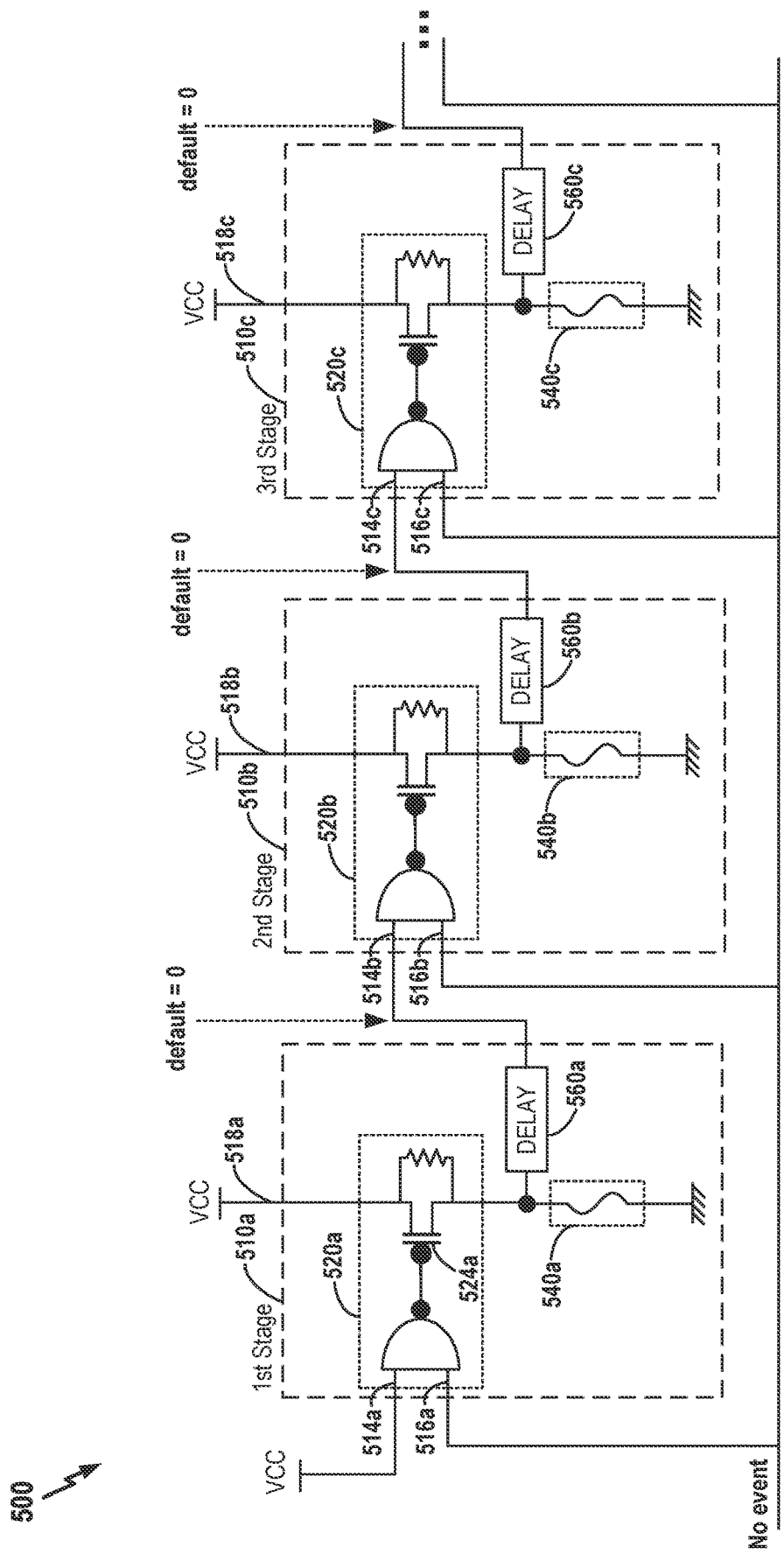
FIG. 5 is an example diagram illustrating an apparatus for performing failure analysis having multiple stages of the failure event counting circuit utilizing first fuse trigger sub-circuits, according to some aspects.

FIG. 5 is an example diagram 500 illustrating an apparatus for performing failure analysis having multiple stages of the failure event counting circuit utilizing first fuse trigger sub-circuits, according to some aspects. As shown in FIG. 5, the apparatus for performing failure analysis may include multiple stages of the failure event counting circuit. FIG. 5 shows the first three stages of the multiple stages as an example. In particular, a first stage 510a may include a first fuse trigger component 520a including a first PMOS transistor, a first e-fuse 540a, and a first delay component 560a. A second stage 510b may include a second fuse trigger component 520b, a second e-fuse 540b, and a second delay component 560b. A third stage 510c may include a third fuse trigger component 520c, a third e-fuse 540c, and a third delay component 560c. A first fuse input line 518a, a second fuse input line 518b, and a third fuse input line 518c are connected to the first fuse trigger component 520a, the second fuse trigger component 520b, and the third fuse trigger component 520c, respectively. The first stage 510a, the second stage 510b, and the third stage 510c each may have components similar to the components of the $N^{th}$ stage 410 of FIG. 4, and thus the details of the components of the first stage 510a, the second stage 510b, and the third stage 510c are omitted for brevity.

An event detector may be connected to a fuse trigger component of each stage. Hence, when the event detector detects a failure event, an event detector signal indicative of the failure event may be provided to all of the multiple stages (e.g., via event detection inputs 516a, 516b, 516c, . . . ). However, as discussed above, unless a stage is activated by a stage activation signal activating the fuse trigger component of the stage, the fuse trigger component may not allow the current to flow directly from VCC at a fuse input line to an e-fuse of the stage. For example, except for the first stage 510a, a default setting initially for the other stages may be a deactivated state. For example, as a default setting, the second stage 510b may be in a deactivated state with the second activation input 514b inputting a low signal (e.g., 0) to the second fuse trigger component 520b, the third stage 510c may be in a deactivated state with the third activation input 514c inputting a low signal (e.g., 0) to the third fuse trigger component 520c. On the other hand, for example, the first stage 510a may always be activated with a first stage activation signal being a high signal (e.g., 1, via VCC) at the first activation input 514a of the first fuse trigger component 520a.

In the example illustrated in FIG. 5, the first stage 510a is already activated by the high signal from VCC at the first activation input 514a activating the first fuse trigger component 520a, but the event detector has not detected any failure event. Hence, no input indicating a failure event is input into the first stage 510a, and thus no e-fuse becomes disconnected. Because the first e-fuse 540a is not disconnected in FIG. 5, the input to the first delay component 560a stays as a low signal (e.g., 0), and thus the output of the first delay component 560a stays as a low signal, which is connected to the second activation input 514b of the second stage 510b. Because the second activation input 514b receives a low signal, the second stage 510b stays in a deactivated state, and the second e-fuse 540b remains connected. Because the second e-fuse 540b is not disconnected, the input to the second delay component 560b stays as a low signal (e.g., 0), and thus the output of the second delay component 560b stays as a low signal, which is connected to the third activation input 514c of the third stage 510c. Similarly, because the third activation input 514c receives a low signal, the third stage 510c stays in a deactivated state, and the third e-fuse 540c remains connected. Because the third e-fuse 540c is not disconnected, the input to the third delay component 560c stays as a low signal (e.g., 0), and thus the output of the third delay component 560c stays as a low signal, which is connected to the third activation input 514c of the third stage 510c.

Figure 6:
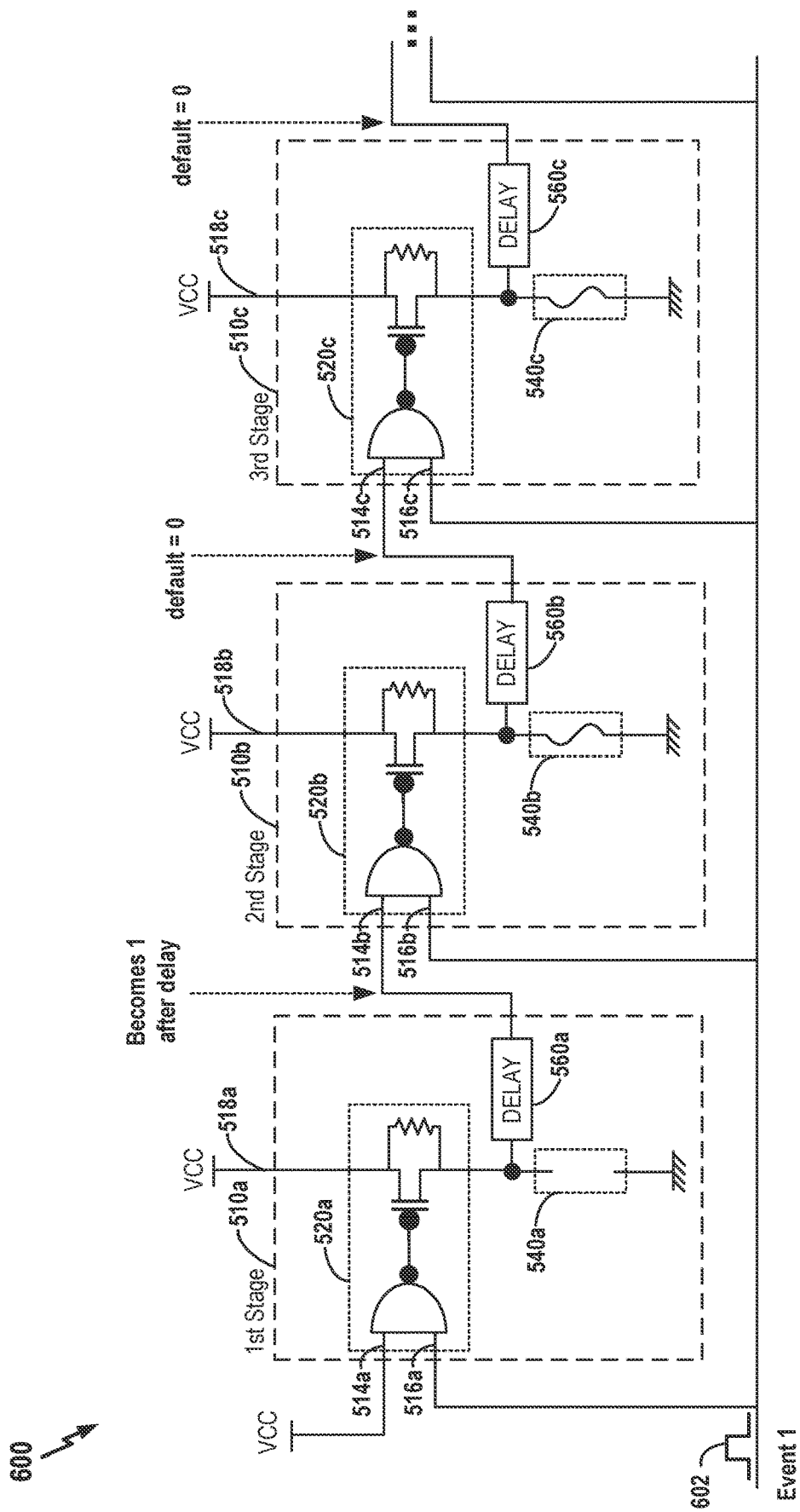
FIG. 6 is an example diagram illustrating the apparatus of FIG. 5 when a first failure event occurs, according to some aspects.

FIG. 6 is an example diagram 600 illustrating the apparatus of FIG. 5 when a first failure event occurs, according to some aspects. The apparatus shown in FIG. 6 is the same apparatus shown in FIG. 5. The example illustrated in FIG. 6 may take place after the example illustrated in FIG. 5.

In the example illustrated in FIG. 6, the event detector has detected a first failure event, and thus provides a first event detector signal 602. Further, the first stage 510a is already activated by the high signal from VCC at the first activation input 514a. Hence, the first event detector signal 602 indicating the first failure event by a high signal may cause the first fuse trigger component 520a to allow the current from VCC at the first fuse input line 518a to directly flow to the first e-fuse 540a, which causes the first e-fuse 540a to disconnect. Prior to the first e-fuse 540a disconnecting, the input to the first delay component 560a may be a low signal (e.g., 0). After the first e-fuse 540a disconnects, the input of the first delay component 560a as well as the output of the first fuse trigger component 520a may maintain a high signal (e.g., 1). The first delay component 560a causes a time delay to this high signal, and thus outputs a second stage activation signal that is a high signal, after the time delay. Due to the time delay, the second stage activation signal does not provide a high signal to the second activation input 514b until the first failure event is over, and thus the second stage 510b is not activated until after the first event detector signal 602 passes. Therefore, the first event detector signal 602 is not conveyed to the second e-fuse 540b of the second stage 510b. Hence, the time delay is used to ensure that the first event detector signal 602 causing the first e-fuse 540a to disconnect does not cause the second e-fuse 540b of the second stage 510b to disconnect at the same time. After the time delay, the second stage activation signal with a high signal is sent to the second activation input 514b, thereby activating the second stage 510b for failure event counting.

Figure 7:
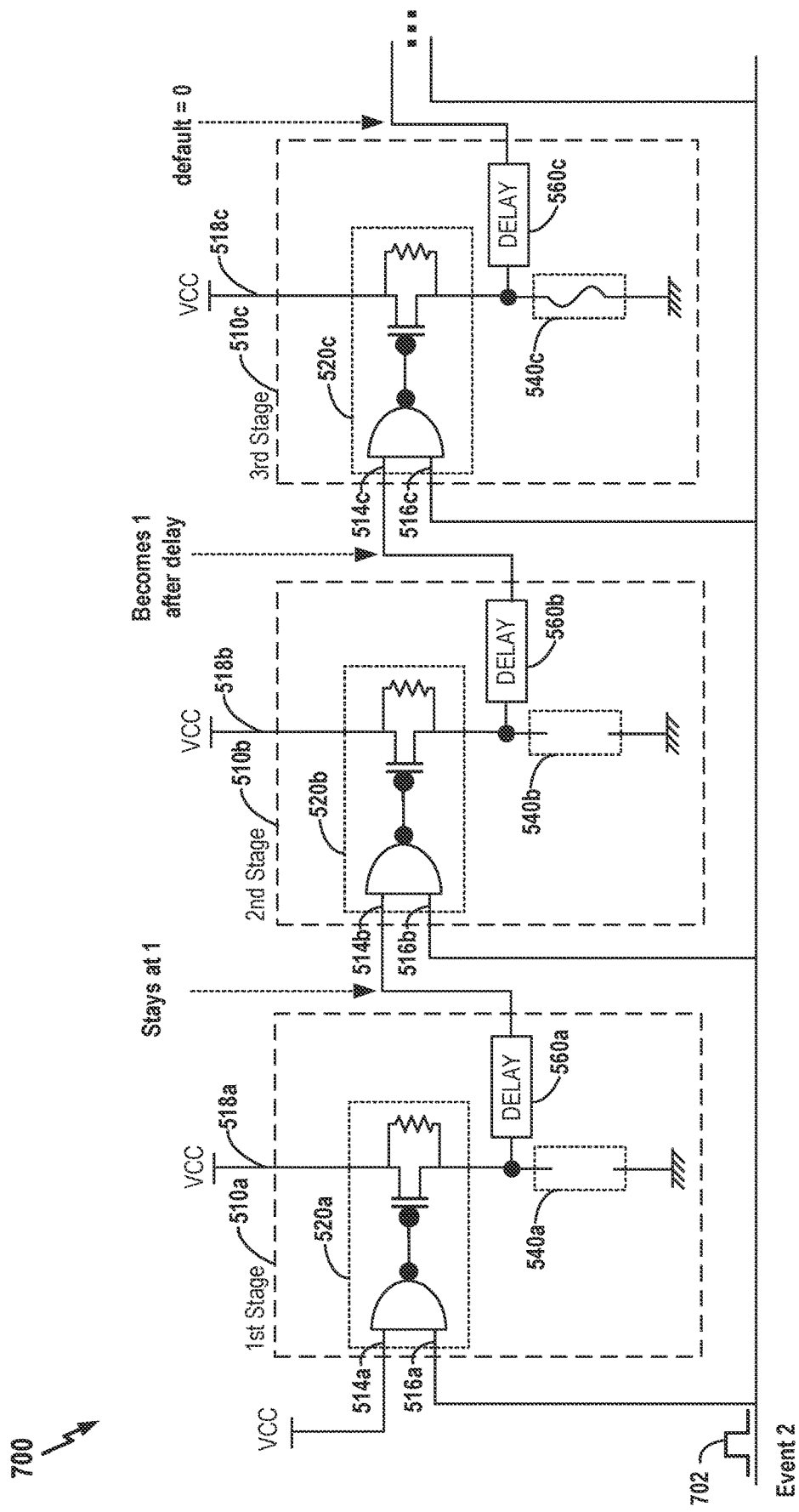
FIG. 7 is an example diagram illustrating the apparatus of FIGS. 5 and 6 when a second failure event occurs after the first failure event, according to some aspects.

FIG. 7 is an example diagram 700 illustrating the apparatus of FIGS. 5 and 6 when a second failure event occurs after the first failure event, according to some aspects. The apparatus shown in FIG. 7 is the same apparatus shown in FIG. 5 and FIG. 6. The example illustrated in FIG. 7 may take place after the example illustrated in FIG. 6.

In the example illustrated in FIG. 7, after the first event detector signal 602 in FIG. 6 disconnects the first e-fuse 540a and causes the second activation signal to activate the second stage 510b, the event detector has detected a second failure event and thus provides a second event detector signal 702. At this point, the second stage 510b is already activated by the second activation signal having the high signal at the second activation input 514b, activating the second fuse trigger component 520b. Hence, the second event detector signal 702 indicating the second failure event by a high signal may cause the second fuse trigger component 520b to allow the current from VCC at the second fuse input line 518b to directly flow to the second e-fuse 540b, which causes the second e-fuse 540b to disconnect. Prior to the second e-fuse 540b disconnecting, the input to the second delay component 560b may be a low signal (e.g., 0). After the second e-fuse 540b disconnects, the input of the first delay component 560a as well as the output of the first fuse trigger component 520a may maintain a high signal (e.g., 1). The second delay component 560b causes a time delay to this high signal, and thus outputs a third stage activation signal that is a high signal after the time delay. Due to the time delay, the third stage activation signal does not provide a high signal to the third activation input 514c until the second failure event is over, and thus the third stage 510c is not activated until after the second event detector signal 702 passes. Therefore, the second event detector signal 702 does not cause the third fuse trigger component 520c to allow the current from VCC at the third fuse input line 518c to directly flow to the third e-fuse 540c of the third stage 510c. Hence, the time delay is used to ensure that the second event detector signal 702 causing the second e-fuse 540b to disconnect does not cause the third e-fuse 540c of the third stage 510c to disconnect at the same time. After the time delay, the third stage activation signal with a high signal is sent to the third activation input 514c, thereby activating the third stage 510c for failure event counting.

Figure 8:
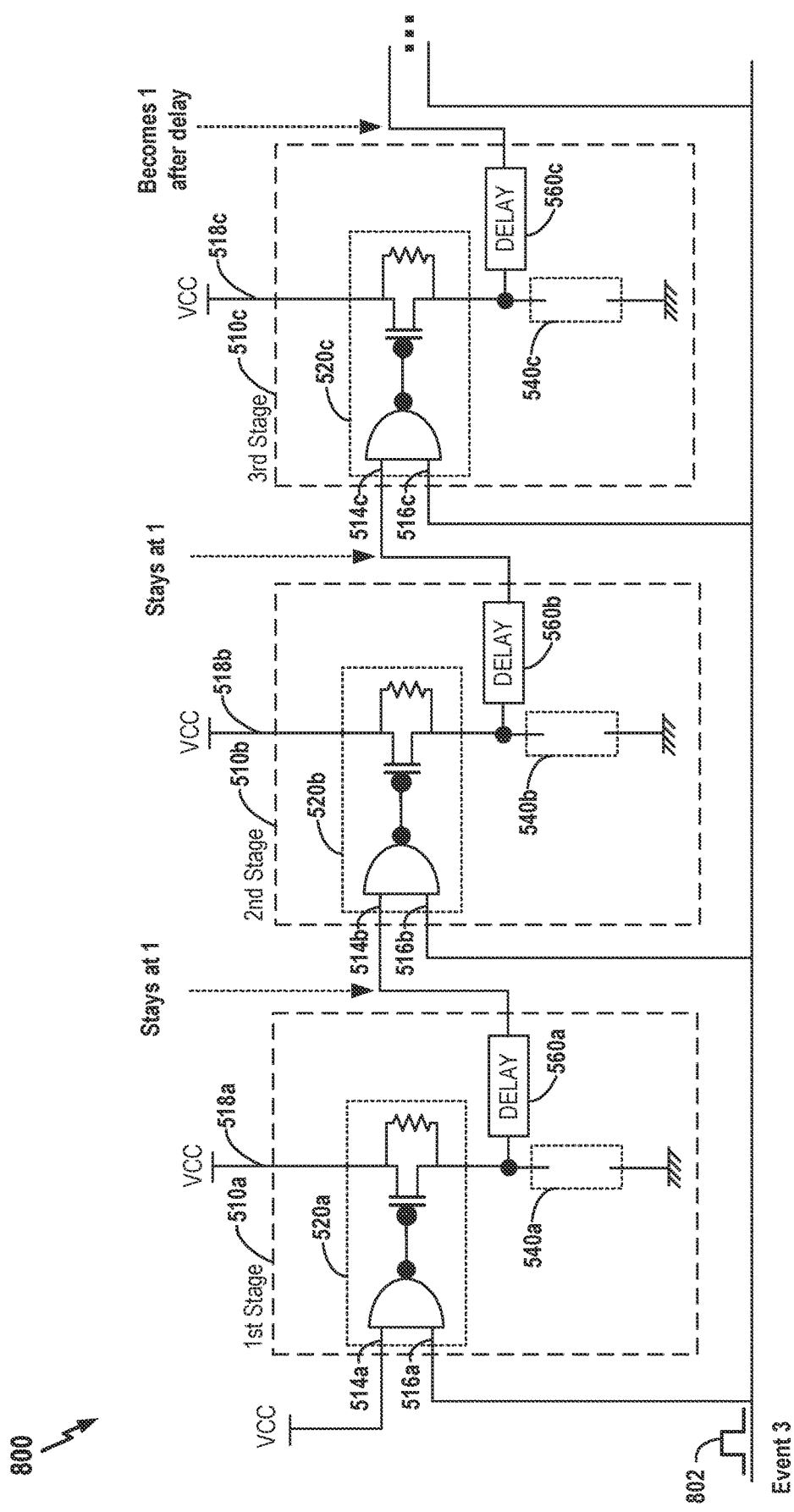
FIG. 8 is an example diagram illustrating the apparatus FIGS. 5-7 when a third failure event occurs after the second failure event, according to some aspects.

FIG. 8 is an example diagram 800 illustrating the apparatus of FIGS. 5-7 when a third failure event occurs after the second failure event, according to some aspects. The apparatus shown in FIG. 8 is the same apparatus shown in FIG. 5. FIG. 6, and FIG. 7. The example illustrated in FIG. 8 may take place after the example illustrated in FIG. 7.

In the example illustrated in FIG. 8, after the second event detector signal 702 in FIG. 7 disconnects the second e-fuse 540b and causes the third activation signal to activate the third stage 510c, the event detector has detected a third failure event and thus provides a third event detector signal 802. At this point, the third stage 510c is already activated by the third activation signal having the high signal at the third activation input 514c. Hence, the third event detector signal 802 indicating the third failure event by a high signal may cause the third fuse trigger component 520c to allow the current from VCC at the third fuse input line 518c to directly flow to the third e-fuse 540c, which causes the third e-fuse 540c to disconnect. Prior to the third e-fuse 540c disconnecting, the input to the third delay component 560c may be a low signal (e.g., 0). After the third e-fuse 540c disconnects, the input of the second delay component 560b as well as the output of the second fuse trigger component 520b may maintain a high signal (e.g., 1). The third delay component 560c causes a time delay to this high signal, and thus outputs a third stage activation signal that is a high signal after the time delay. Due to the time delay, the third stage activation signal does not provide a high signal to the third activation input 514c until the third failure event is over, and thus a subsequent stage is not activated until after the third event detector signal 802 passes. Therefore, the third event detector signal 802 does not cause a subsequent fuse trigger component of the subsequent stage to allow the current from VCC to directly flow to a subsequent e-fuse of the subsequent stage. Hence, the time delay is used to ensure that the third event detector signal 802 causing the third e-fuse 540c to disconnect does not cause the e-fuse of the subsequent stage to disconnect at the same time.

As shown in FIGS. 5-8, each time the event detector detects a failure event, an e-fuse of a respective stage may disconnect. Therefore, a number of failure events may be determined by counting a number of disconnected e-fuses. In an aspect, the number of disconnected e-fuses may be determined by counting a number of stages outputting a high signal at outputs of respective delay components. Hence, in an aspect, the apparatus for performing failure analysis may further include a counter circuit configured to generate a count of a number of e-fuses from the multiple stages that have disconnected in response to one or more failure events. In this aspect, an output node of the $N^{th}$ delay component from the $N^{th}$ stage may be connected to the counter circuit to indicate to the counter circuit that the $N^{th}$ e-fuse has disconnected.

Figure 9:
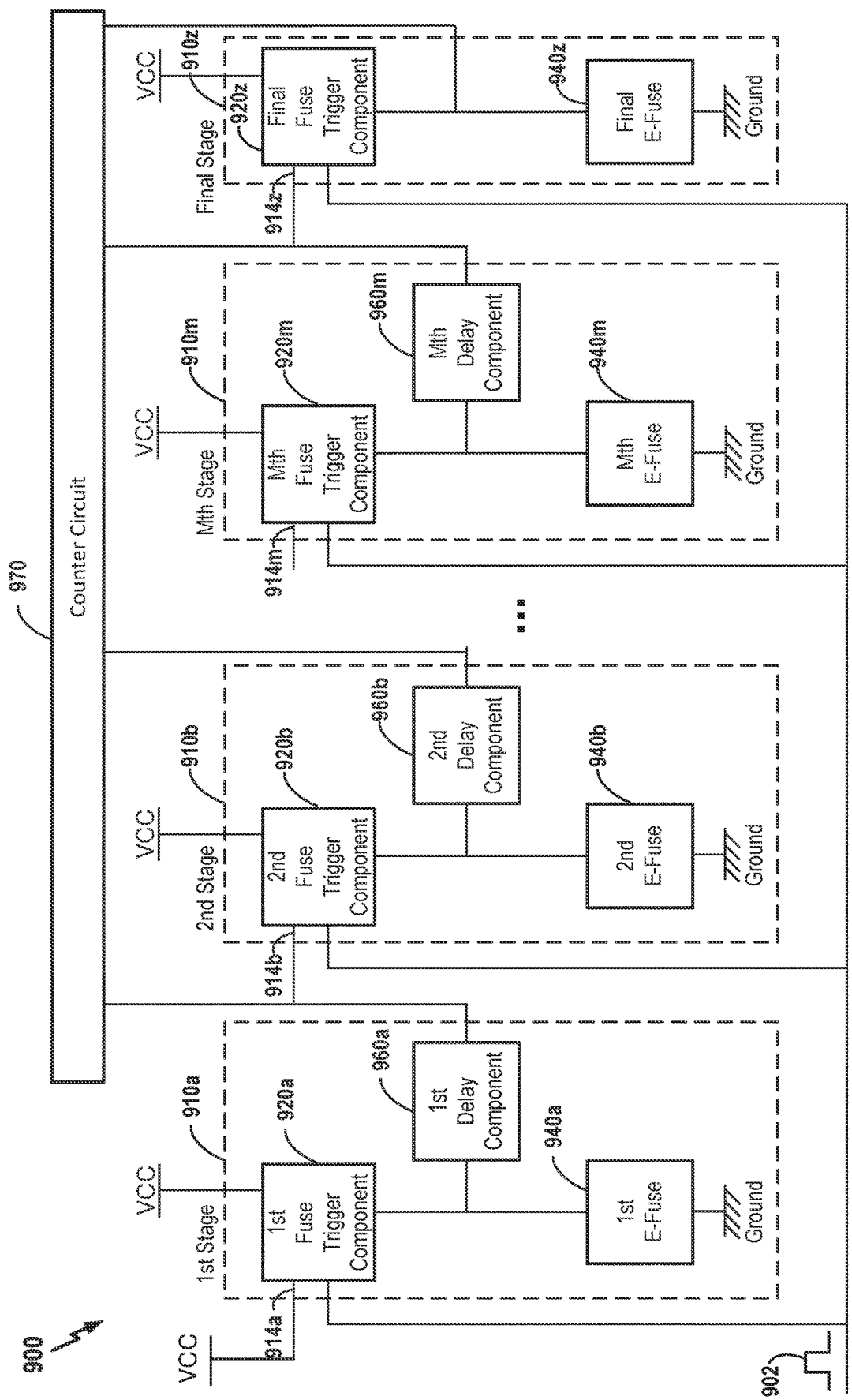
FIG. 9 is an example diagram illustrating an apparatus for performing failure analysis having multiple stages of the failure event counting circuit, where the multiple stages are connected to a counter circuit configured to generate a count of the number of e-fuses from the multiple stages that have disconnected, according to some aspects.

FIG. 9 is an example diagram 900 illustrating an apparatus for performing failure analysis having multiple stages of the failure event counting circuit, where the multiple stages are connected to a counter circuit configured to generate a count of the number of e-fuses from the multiple stages that have disconnected, according to some aspects.

As shown in FIG. 9, the apparatus for performing failure analysis may include M stages of the failure event counting circuit, where M is a positive integer. In particular, a first stage 910a of the M stages may include a first fuse trigger component 920a, a first e-fuse 940a, and a first delay component 960a. A second stage 910b of the M stages may include a second fuse trigger component 920b, a second e-fuse 940b, and a second delay component 960b. An $M^{th}$ stage 910m of the M stages may include an $M^{th}$ fuse trigger component 920m, an $M^{th}$ e-fuse 940m, and an $M^{th}$ delay component 960m. The apparatus for performing failure analysis may further include a final stage 910z of the failure event counting circuit connected to a last stage of the plurality of stages of the failure event counting circuit. The final stage 910z of the failure event counting circuit may include a final fuse trigger component 920z and a final e-fuse 940z. The first stage 910a, the second stage 910b, the $M^{th}$ stage 910m, and the final stage 910z may have respective fuse trigger components, e-fuses, and delay components that are similar to respective fuse trigger components, e-fuses, and delay components of the first stage 310a, the second stage 310b, the $M^{th}$ stage 310m, and the final stage 310z of FIG. 3, and thus the details of the respective fuse trigger components, e-fuses, and delay components of the first stage 910a, the second stage 910b, the $M^{th}$ stage 910m, and the final stage 910z are omitted for brevity.

As shown in FIG. 9, the apparatus may further include a counter circuit 970 configured to generate a count of a number of e-fuses from the M stages and the final stage that have disconnected in response to one or more failure events. For each of the M stages, an output node of a respective delay component may be connected to the counter circuit 970 to indicate to the counter circuit 970 that the respective e-fuse has disconnected. For example, an output node of the first delay component 960a may be connected to the counter circuit 970 to indicate that the first e-fuse 940a has disconnected in response to the first failure event, an output node of the second delay component 960b may be connected to the counter circuit 970 to indicate that the second e-fuse 940b has disconnected in response to the second failure event, and an output node of the $M^{th}$ delay component 960m may be connected to the counter circuit 970 to indicate that the $M^{th}$ e-fuse 940m has disconnected in response to the $M^{th}$ failure event. Further, for the final stage 910z, an output node of the final fuse trigger component 920z may be connected to the counter circuit 970 to indicate that the final e-fuse 940z has disconnected in response to the final failure event.

In an example, as discussed above, an e-fuse disconnecting may cause an output node of a respective fuse trigger component to have a high signal (e.g., 1). Therefore, by counting a number of high signals from M stages, the counter circuit 970 may generate a count of a number of e-fuses that have disconnected. For example, if the first failure event causing the first event detector signal has caused the first e-fuse 940a of the first stage 910a to disconnect and the second failure event causing the second event detector signal has caused the second e-fuse 940b of the second stage 910b, then the output node of the first delay component 960a and the output node of the second delay component 960b may have a high signal (e.g., 1), and thus the counter circuit 970 may generate 2 as a count of a number of e-fuses that have disconnected.

In some aspects, the counter circuit 970 may include a scan chain circuit. In some aspects, the counter circuit 970 may include a status register circuit.

In an aspect, the multiple stages of the failure event counting circuit may further include respective lighting components. For example, an $N^{th}$ light emitting component may be connected to the $N^{th}$ e-fuse and may be configured to illuminate in response to the $N^{th}$ e-fuse disconnecting. Hence, a number of failure events may be determined by counting a number of the lighting components illuminating. In some aspects, the $N^{th}$ light emitting component may include a light emitting diode (LED). In some aspects, the $N^{th}$ light emitting component may include an LED connected to a resistor in series.

Figure 10:
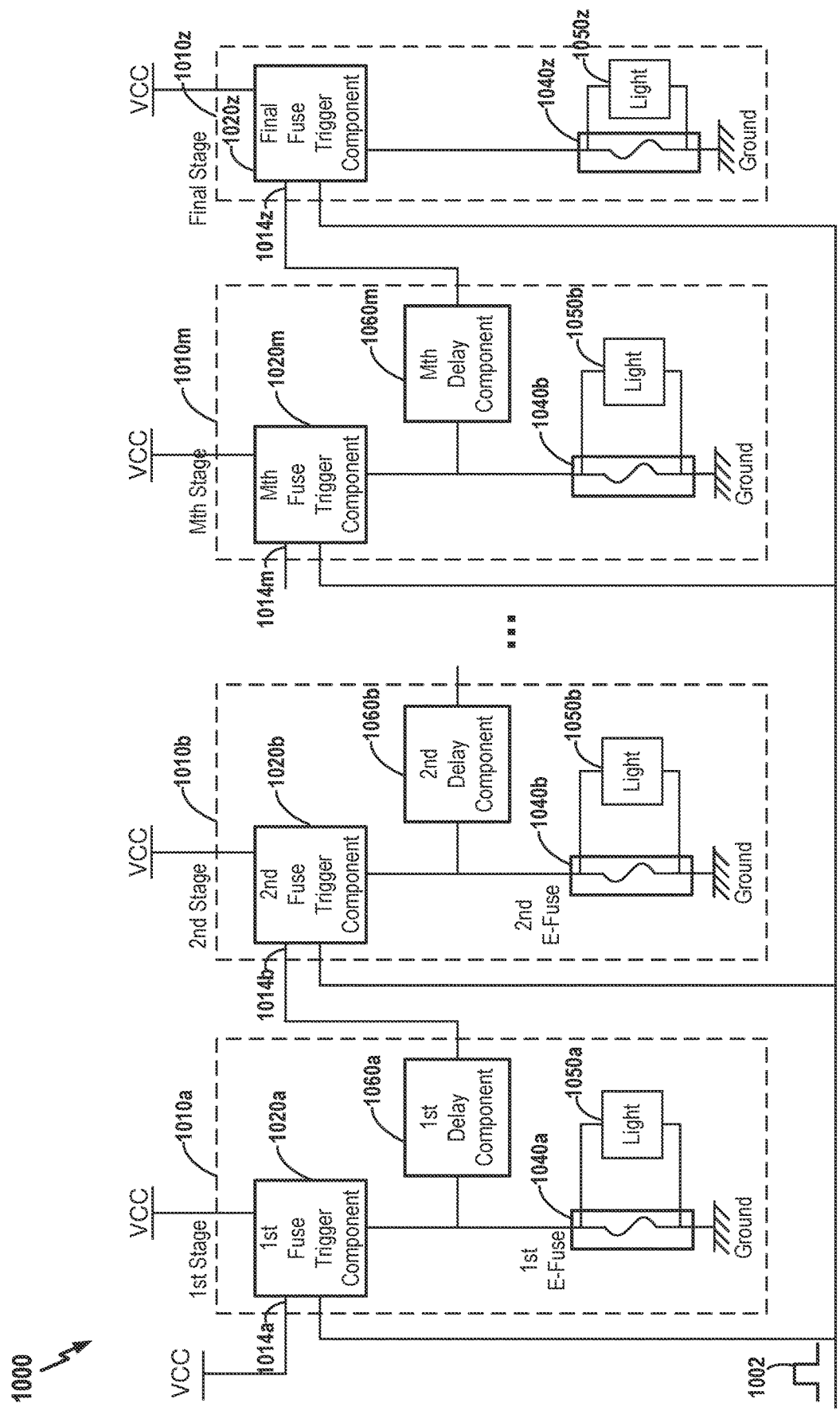
FIG. 10 is an example diagram illustrating an apparatus for performing failure analysis having multiple stages of the failure event counting circuit, where the multiple stages include respective lighting components, according to some aspects.

FIG. 10 is an example diagram 1000 illustrating an apparatus for performing failure analysis having multiple stages of the failure event counting circuit, where the multiple stages include respective lighting components, according to some aspects.

As shown in FIG. 10, the apparatus for performing failure analysis may include M stages of the failure event counting circuit, where M is a positive integer. In particular, a first stage 1010*a* of the M stages may include a first fuse trigger component 1020*a*, a first e-fuse 1040*a*, and a first delay component 1060*a*. A second stage 1010*b* of the M stages may include a second fuse trigger component 1020*b*, a second e-fuse 1040*b*, and a second delay component 1060*b*. An $M^{th}$ stage 1010*m* of the M stages may include an $M^{th}$ fuse trigger component 1020*m*, an $M^{th}$ e-fuse 1040*m*, and an $M^{th}$ delay component 1060*m*. The apparatus for performing failure analysis may further include a final stage 1010*z* of the failure event counting circuit connected to a last stage of the plurality of stages of the failure event counting circuit. The final stage 1010*z* of the failure event counting circuit may include a final fuse trigger component 1020*z* and a final e-fuse 1040*z*. The first stage 1010*a*, the second stage 1010*b*, the $M^{th}$ stage 1010*m*, and the final stage 1010*z* may have respective fuse trigger components, e-fuses, and delay components that are similar to respective fuse trigger components, e-fuses, and delay components of the first stage 310*a*, the second stage 310*b*, the $M^{th}$ stage 310*m*, and the final stage 310*z* of FIG. 3, and thus the details of the respective fuse trigger components, e-fuses, and delay components of the first stage 1010*a*, the second stage 1010*b*, the $M^{th}$ stage 1010*m*, and the final stage 1010*z* are omitted for brevity Each of the multiple stages may further include a respective light emitting component configured to illuminate in response to a respective e-fuse disconnecting. In FIG. 10, the first stage 1010*a* may include a first light emitting component 1050*a* connected to both ends of the first e-fuse 1040*a* and configured to illuminate in response to the first e-fuse 1050*a* disconnecting. The second stage 1010*b* may include a second light emitting component 1050*b* connected to both ends of the second e-fuse 1040*b* and configured to illuminate in response to the second e-fuse 1040*b* disconnecting. The $M^{th}$ stage 1010*m* may include a $M^{th}$ light emitting component 1050*m* connected to both ends of the $M^{th}$ e-fuse 1040*m* and configured to illuminate in response to the $M^{th}$ e-fuse 1040*m* disconnecting. Further, final stage 1010*z* may include a final light emitting component 1050*z* connected to both ends of the final e-fuse 1040*z* and configured to illuminate in response to the final e-fuse 1040*z* disconnecting.

Figure 11:
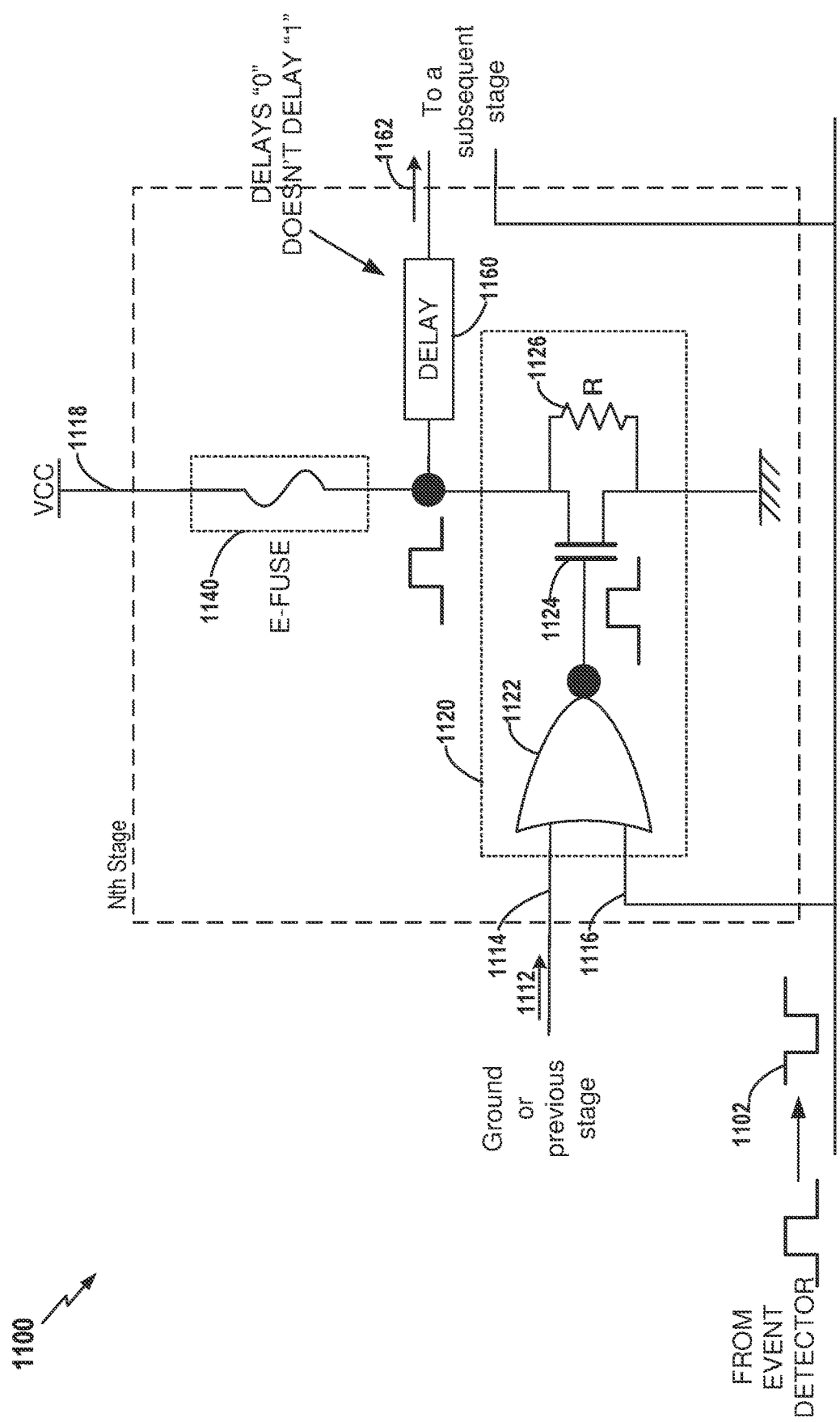
FIG. 11 is an example diagram illustrating an $N^{th}$ stage of the multiple stages of the failure event counting circuit utilizing a second fuse trigger sub-circuit, according to some aspects.

In an example, if the first failure event causing the first event detector signal has caused the first e-fuse 1040*a* of the first stage 1010*a* to disconnect, then the first light emitting component 1050*a* may illuminate in response to the first e-fuse 1040*a* disconnecting and the second light emitting component 1050*b* may illuminate in response to the second e-fuse 1040*b* disconnecting. Hence, it can be determined that a number of failure events is two, by counting the number of light emitting components illuminating, FIG. 11 is an example diagram 1100 illustrating an $N^{th}$ stage 1110 of the multiple stages of the failure event counting circuit utilizing a second fuse trigger sub-circuit, according to some aspects. The $N^{th}$ stage 1110 may include an $N^{th}$ fuse trigger component 1120, an $N^{th}$ e-fuse 1140, and an $N^{th}$ delay component 1160. For example, the $N^{th}$ stage 1110 shown in FIG. 11 may be an example of the $N^{th}$ stage 210 shown in FIG. 2. Hence, the $N^{th}$ fuse trigger component 1120, the $N^{th}$ e-fuse 1140, and the $N^{th}$ delay component 1160 of the $N^{th}$ stage 1110 shown in FIG. 11 may be at least similar to the $N^{th}$ fuse trigger component 220, the $N^{th}$ e-fuse 240, and the $N^{th}$ delay component 260 of the $N^{th}$ stage 210 shown in FIG. 2, which are explained in detail above in reference to FIG. 2.

As shown in FIG. 11, the $N^{th}$ fuse trigger component 1120 includes a NOR gate 1122 that has an $N^{th}$ stage activation input 1114 to receive an $N^{th}$ stage activation signal and an event detection input 1116 to receive an event detector signal 1102 from a failure event detector. When a NOR gate is used, an $N^{th}$ stage activation signal 1112 may activate the $N^{th}$ stage 1110 when the $N^{th}$ stage activation signal is a low signal (e.g., 0). Hence, in some aspects, if the $N^{th}$ stage 1110 is a first stage of the failure event counting circuit, the $N^{th}$ stage activation input 1114 may be connected to a ground and thus the $N^{th}$ stage activation signal 1112 may be a low signal (e.g., 0). Therefore, the first stage of the failure event may always be activated for failure event counting. In some aspects, if the $N^{th}$ stage 1110 is not the first stage, then the $N^{th}$ stage activation signal 1112 may be provided from a previous stage (e.g., $(N-1)^{th}$ stage) of the failure event counting circuit, after an e-fuse of the previous stage has disconnected.

The output of the NOR gate 1122 is connected to a gate of an n-channel metal-oxide semiconductor (NMOS) transistor 1124. A drain of the NMOS transistor 1124 is connected to a ground and a drain of the NMOS transistor 1124 is connected to one end of the $N^{th}$ e-fuse 1140, which is connected to the VCC at the other end. The source and the drain of the NMOS transistor 1124 are connected to each other via a resistor 1126. The source of the NMOS transistor 1124 may be an output of the $N^{th}$ fuse trigger component 1120, which is connected to the $N^{th}$ e-fuse 1140 and the $N^{th}$ delay component 1160.

When the NOR gate 1122 is used for the $N^{th}$ fuse trigger component 1120, a low signal in the event detector signal 1102 may indicate a failure event. Hence, the event detector signal 1102 provided by the event detector may have a low signal to indicate a failure event. If there is a high signal to the $N^{th}$ stage activation input 1114, the NOR gate 1122 may output 0 or a low signal to a gate of the NMOS transistor 1124 regardless of what type of signal is received at the $N^{th}$ stage activation input 1114, which switches off the NMOS transistor 1124. With the NMOS transistor 1124 switched off, the current from the VCC via the fuse input line 1118 flows to the resistor 1126, which allows little or no current into the e-fuse 1140 without disconnecting the e-fuse 1140. On the other hand, if the $N^{th}$ stage 1110 is activated by an $N^{th}$ stage activation signal (e.g., low signal) provided to the $N^{th}$ stage activation input 1114, then the NOR gate 1122 may receive the event detector signal 1102 with a high signal and a low signal and output an inverted version of the event detector signal 1102 to the gate of the NMOS transistor 1124. When the NMOS transistor 424 receives the high signal of the inverted version of the event detector signal 1102, the NMOS transistor 1124 may switch on to allow the current from the VCC via the fuse input line 1118 to flow directly to the $N^{th}$ e-fuse 1140 via the drain of the NMOS transistor 1124, which causes the $N^{th}$ e-fuse 1140 to disconnect. Hence, for example, the high signal of the inverted version of the event detector signal 1102 may cause the $N^{th}$ e-fuse 1140 to disconnect, if the $N^{th}$ stage 1110 is activated by an $N^{th}$ stage activation signal.

Prior to the $N^{th}$ e-fuse 1140 disconnecting, the input to the $N^{th}$ delay component 1160 may be a high signal (e.g., 1). After the $N^{th}$ e-fuse 1140 disconnects, the resistor 1126 may hold the value of the signal at the output of the $N^{th}$ fuse trigger component 1120 and the input of the $N^{th}$ delay component 1160 to a low signal (e.g., 0). The $N^{th}$ delay component 1160 causes a time delay to this low signal, and thus outputs a subsequent stage activation signal 1162 that is a signal changed to a low signal from a previous high signal, after the time delay. As discussed above, the time delay is used to ensure that the event detector signal 1102 causing the $N^{th}$ e-fuse 1140 to disconnect does not cause an e-fuse of the subsequent stage to disconnect at the same time. The subsequent stage activation signal is sent to a subsequent stage to activate the subsequent stage.

In some aspects, the apparatus for performing failure analysis may further include a latch component including a set/reset (SR) latch and connected to the $N^{th}$ fuse trigger component to prevent the event detector signal from entering the subsequent stage of the multiple stages. For example, the latch component may receive an event detector signal indicating a failure event from the event detector and initially pass the event detector signal to the $N^{th}$ stage. When the event detector signal indicating the failure event is received at the $N^{th}$ stage, the $N^{th}$ e-fuse disconnects. Further, when the event detector signal is received at the latch component, a latch delay component of the latch component may cause a latch time delay to the event detector signal, and thus the event detector signal after the latch time delay may cause the SR latch to set. When the SR latch is set, any event detector signal indicating a failure event may not pass the latch component to the $N^{th}$ stage. The SR latch may be reset (e.g., manually), to allow an event detector signal to pass the latch component to the $N^{th}$ stage. As such, the latch component may allow one event to disconnect only one e-fuse at a time, and thus may allow monitoring of only one event at a time. For example, the latch component may be useful if a user desires to record a series of events as one event, where the events in one series occur close in time. Instead of disconnecting multiple fuses by a series of events, the latch component may allow disconnecting only one fuse for a series events. After the series of events, the SR latch may be reset so that a subsequent fuse may be disconnected for a next series of events.

In some aspects, the latch time delay may be greater than a pulse duration of the failure event. In some aspects, the time delay may be greater than a time it takes to disconnect the $N^{th}$ e-fuse.

Figure 12:
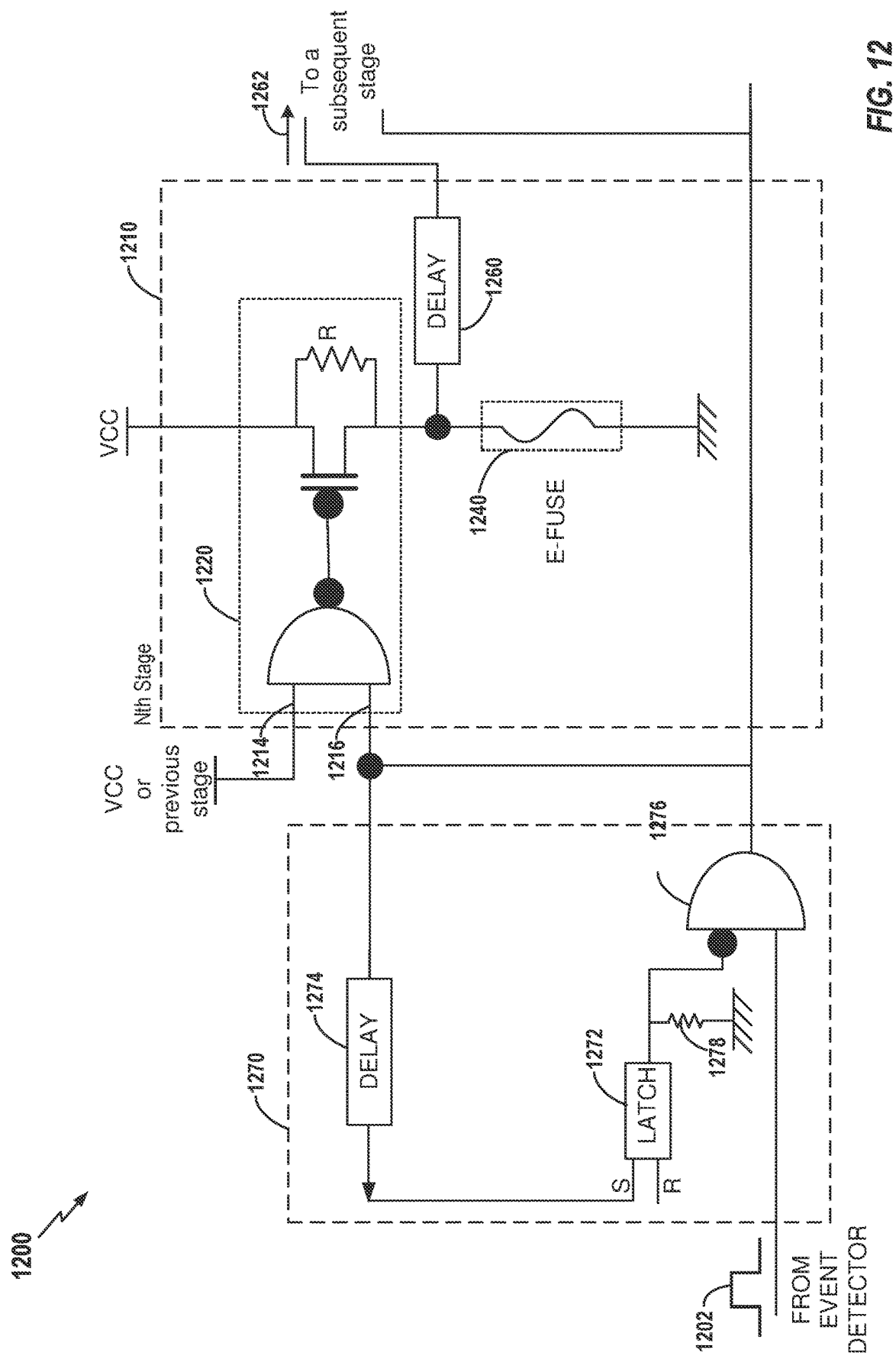
FIG. 12 is an example diagram illustrating an $N^{th}$ stage of the multiple stages of the failure event counting circuit connected to a set/reset (SR) latch component, according to some aspects.

FIG. 12 is an example diagram 1200 illustrating an $N^{th}$ stage 1210 of the multiple stages of the failure event counting circuit connected to a latch component including a set/reset (SR) latch, according to some aspects.

The $N^{th}$ stage 1210 may include an $N^{th}$ fuse trigger component 1220, an $N^{th}$ e-fuse 1240, and an $N^{th}$ delay component 1260. For example, the $N^{th}$ stage 1210 shown in FIG. 12 may be an example of the $N^{th}$ stage 210 shown in FIG. 2. Hence, the $N^{th}$ fuse trigger component 1220, the $N^{th}$ e-fuse 1240, and the $N^{th}$ delay component 1260 of the $N^{th}$ stage 1210 shown in FIG. 12 may be at least similar to the $N^{th}$ fuse trigger component 420, the $N^{th}$ e-fuse 440, and the $N^{th}$ delay component 460 of the $N^{th}$ stage 410 shown in FIG. 4, which are explained in detail above in reference to FIG. 4. Therefore, detailed explanations of the $N^{th}$ fuse trigger component 1220, the $N^{th}$ e-fuse 1240, and the $N^{th}$ delay component 1260 are omitted for brevity.

As shown in FIG. 12, a latch component 1270 may include an SR latch 1272 and a latch delay component 1274. The latch component 1270 may further include an AND gate 1276 and a pull-down resistor 1278. The latch component 1270 may be connected to an event detector to receive an event detector signal 1202 indicating a failure event, where the event detector signal 1202 is provided to a first input of an AND gate 1276 of the latch component 1270. Initially, when the SR latch 1272 is set, a second input of the AND gate 1276 receives a high signal, and thus the AND gate 1276 passes the event detector signal 1202 to the fuse trigger components of the multiple stages. When the event detector signal 1202 passes through the AND gate 1276, the event detector signal 1202 is input into the $N^{th}$ fuse trigger component 1220 via an event detection signal line 1216. If a high signal is received as an $N^{th}$ stage activation signal at an activation input 1214, the event detector signal 1202 causes the $N^{th}$ e-fuse 1240 to disconnect. At the same time, the latch delay component 1274 causes the time delay on the event detector signal 1202 that has passed through the AND gate 1276, and the event detector signal 1202 after the time delay is provided to the SR latch 1272 to cause the SR latch 1272 to set. When the SR latch 1272 is set, a low signal may be provide to the second input of the AND gate 1276, and thus any subsequent event detector signal that is received at the first input of the AND gate does not pass through the AND gate 1276. That is, after the SR latch 1272 is set, the AND gate 1276 may output a low signal regardless of an event detector signal, until the SR latch 1272 is manually reset.

In some aspects, the apparatus for performing failure analysis may further include a voltage capture circuit configured to detect a maximum voltage magnitude during each failure event, a decoder circuit configured to convert a count of a number of disconnected e-fuses in the M stages to an apparatus voltage magnitude, and a magnitude comparison circuit. In this aspect, the magnitude comparison circuit may compare the detected maximum voltage magnitude and the apparatus voltage magnitude. In some aspects, the apparatus voltage magnitude may represent an apparatus voltage magnitude associated with a previous failure event. If the detected maximum voltage magnitude exceeds the apparatus voltage magnitude, the magnitude comparison circuit may output a first signal as the event detector signal to the multiple stages to cause an e-fuse of one of the multiple stages to disconnect. If the detected maximum voltage magnitude is less than or equal to the apparatus voltage magnitude, the magnitude comparison circuit may output a second signal as the event detector signal to the multiple stages, where the second signal is different from the first signal.

For example, the decoder circuit (e.g., digital-to-analog converter) may be connected to each of the M stages, and may count a number of disconnected e-fuses so far. Each disconnected e-fuse may represent a certain voltage (e.g., 1 V). Hence, if the decoder circuit determines that the number of disconnected e-fuses is 2, then the decoder circuit may convert the 2 disconnected e-fuses to 2 V, and 2 V is provided to the magnitude comparison circuit as the watermark reference. When the event detector detects a failure event, then a maximum voltage magnitude during the failure event is detected and provided to the magnitude comparison circuit. If the detected maximum voltage magnitude is 4 V and thus exceeds the watermark reference, then the magnitude comparison circuit may output the first signal to disconnect an additional e-fuse. This increases the number of the disconnected e-fuses to 3, and thus the decoder circuit changes the watermark reference to 3 V. The detected maximum voltage magnitude of 4 V still exceeds the watermark reference of 3 V, and thus the magnitude comparison circuit again outputs the first signal to disconnect another e-fuse. This increases the number of the disconnected e-fuses to 4, and thus the decoder circuit changes the watermark reference to 4 V. Now, the detected maximum voltage magnitude of 4 V does not exceed the watermark reference of 4 V, and thus the magnitude comparison circuit outputs the second signal to stop disconnecting any other e-fuses. Therefore, the magnitude comparison circuit continues to send the first signal until the watermark reference converted from the number of disconnected e-fuses reaches the detected maximum voltage magnitude.

Figure 13:
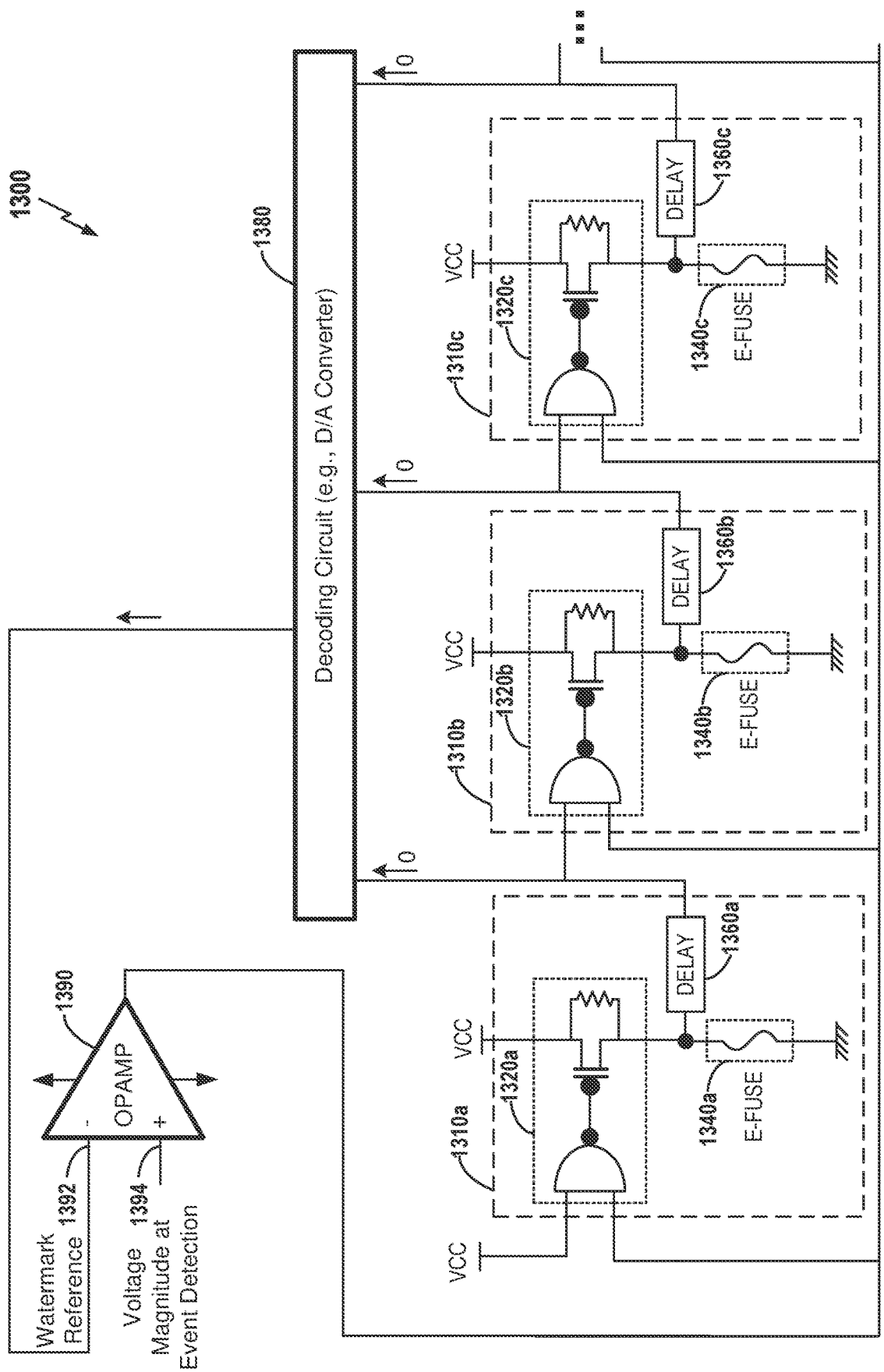
FIG. 13 is an example diagram illustrating an apparatus for performing failure analysis including multiple stages of the failure event counting circuit and further including a magnitude comparison circuit, according to some aspects.

FIG. 13 is an example diagram 1300 illustrating an apparatus for performing failure analysis including multiple stages of the failure event counting circuit and further including a magnitude comparison circuit, according to some aspects. As shown in FIG. 13, the apparatus for performing failure analysis may include multiple stages of the failure event counting circuit. FIG. 13 shows the first three stages of the multiple stages as an example. In particular, a first stage 1310a may include a first fuse trigger component 1320a, a first e-fuse 1340a, and a first delay component 1360a. A second stage 1310b may include a second fuse trigger component 1320b, a second e-fuse 1340b, and a second delay component 1360b. A third stage 1310c may include a third fuse trigger component 1320c, a third e-fuse 1340c, and a third delay component 1360c. The first stage 1310a, the second stage 1310b, and the third stage 1310e each may have components similar to the components of the $N^{th}$ stage 410 of FIG. 4, and thus the details of the components of the first stage 1310a, the second stage 1310b, and the third stage 1310c are omitted for brevity.

A decoder circuit 1380 (e.g., digital-to-analog converter) may be connected to each stage and count a number of disconnected e-fuses in the M stages. As shown in FIG. 13, the decoder circuit 1380 may be connected to output nodes of the delay components of the M stages, including the first delay component 1360a, the second delay component 1360b, and the third delay component 1360c. If an e-fuse of a particular stage remains connected, the output of a respective fuse trigger component provides a low signal (e.g., 0), and thus an output of a respective delay component provides a low signal (e.g., 0). If an e-fuse of a particular stage disconnects, the output of a respective fuse trigger component provides a high signal (e.g., 1), and thus an output of a respective delay component provides a high signal (e.g., 1) with a time delay. By counting a number of the high signal, the decoder circuit 1380 may count the number of disconnected e-fuses.

After counting the number of disconnected e-fuses, the decoder circuit 1380 may convert a count of the number of disconnected e-fuses in the M stages to an apparatus voltage magnitude. Each disconnected e-fuse may represents a certain voltage value. For example, if the decoder circuit 1380 determines that the number of disconnected e-fuses is 2, then the decoder circuit 1380 converts the 3 disconnected e-fuses to the apparatus voltage magnitude of 3 V. In the example shown in FIG. 13, the number of disconnected e-fuses is 0, and thus the decoder circuit 1380 converts the 0 disconnected e-fuses to the apparatus voltage magnitude of 0 V. The decoder circuit 1380 may send the apparatus voltage magnitude to a watermark input 1392 of the magnitude comparison circuit 1390 as the watermark reference.

In an aspect, a voltage capture circuit (not shown) may be configured to detect a maximum voltage magnitude during each failure event detected by the event detector. The voltage capture circuit may be included in the apparatus for performing failure analysis or may be a separate component from the apparatus. The maximum voltage magnitude may be provided to the magnitude comparison circuit 1390 via the maximum voltage input 1394 of the magnitude comparison circuit 1390. For example, if the voltage capture circuit detects the maximum voltage magnitude during a first failure event to be 2 V, then 2 V is provided to the magnitude comparison circuit 1390.

The magnitude comparison circuit 1390 may compare the detected maximum voltage magnitude and the apparatus voltage magnitude. If the detected maximum voltage magnitude exceeds the apparatus voltage magnitude, the magnitude comparison circuit 1390 may output a first signal (e.g., 1) as the event detector signal to the M stages, to cause an e-fuse of one of the M stages to disconnect. On the other hand, if the detected maximum voltage magnitude is less than or equal to the apparatus voltage magnitude, the magnitude comparison circuit 1390 may output a second signal (e.g., 0) as the event detector signal to the M stages, where the second signal is different from the first signal. For example, the second signal may not disconnect any connected e-fuses.

In the example shown in FIG. 13, if the detected maximum voltage magnitude is 2V, the magnitude comparison circuit 1390 may output the first signal as the event detector signal, because the detected maximum voltage magnitude of 2V exceeds the apparatus voltage magnitude of 0 V.

Figure 14:
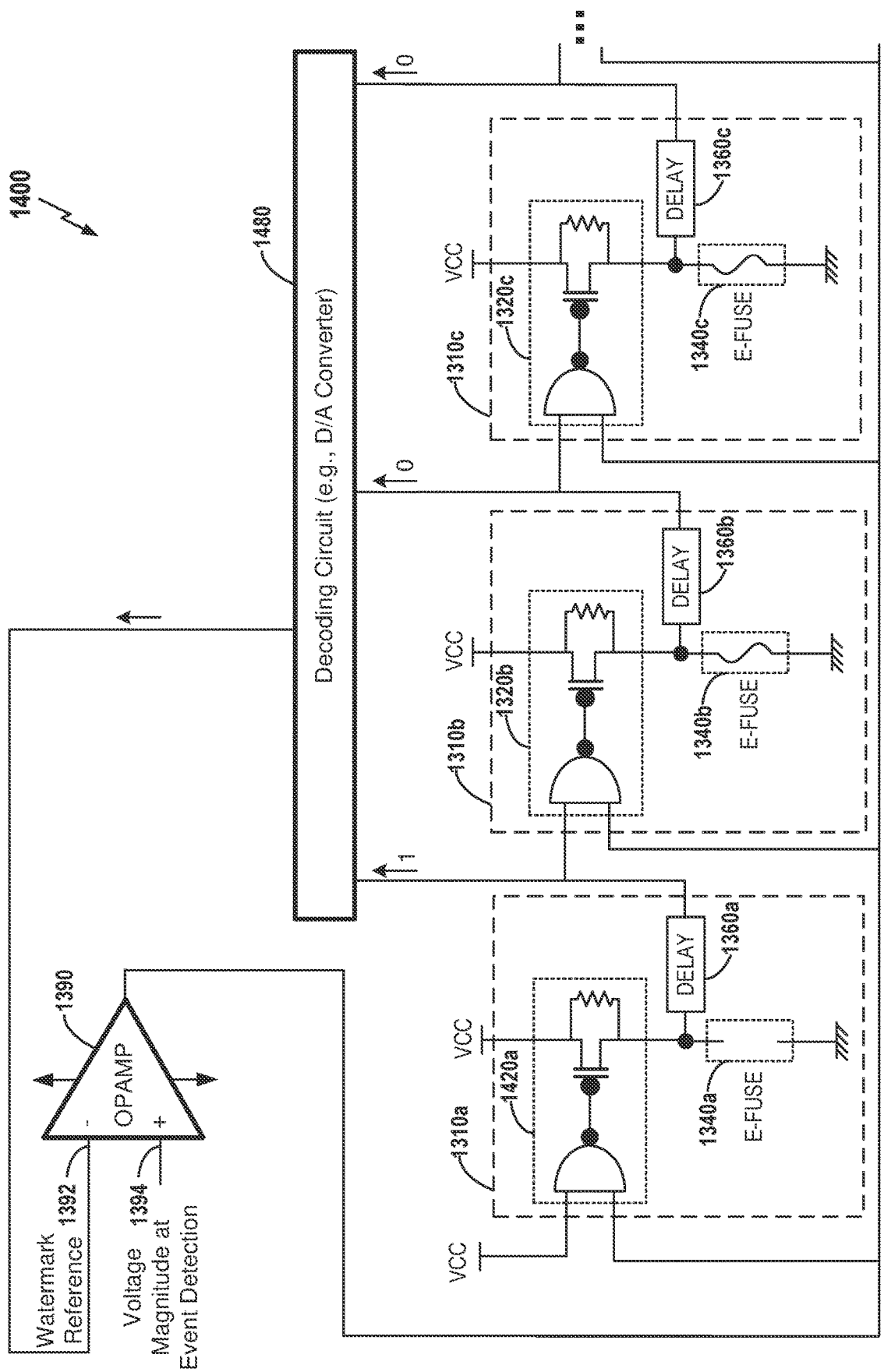
FIG. 14 is an example diagram illustrating the apparatus of FIG. 13 when a first e-fuse of a first stage is disconnected, according to some aspects.

FIG. 14 is an example diagram 1400 illustrating the apparatus of FIG. 13 when a first e-fuse of a first stage is disconnected, according to some aspects. FIG. 14 shows an example that occurs after the example shown in FIG. 13.

When the first signal from the example shown in FIG. 13 is provided to the M stages as the input signal, the first signal may cause the first e-fuse 1440a to disconnect, and thereby causing the first delay component 1460a to output a high signal (e.g., 1) after the time delay. In the example shown in FIG. 14, the decoder circuit 1380 may determine that the number of disconnected e-fuses is 1, and thus may convert the 1 disconnected e-fuse to the apparatus voltage magnitude of 1 V, which is provided to a watermark input 1392 of the magnitude comparison circuit 1390 as the watermark reference. Because the detected maximum voltage magnitude of 2V still exceeds the apparatus voltage magnitude of 1 V, the magnitude comparison circuit 1390 may again output the first signal as the event detector signal.

Figure 15:
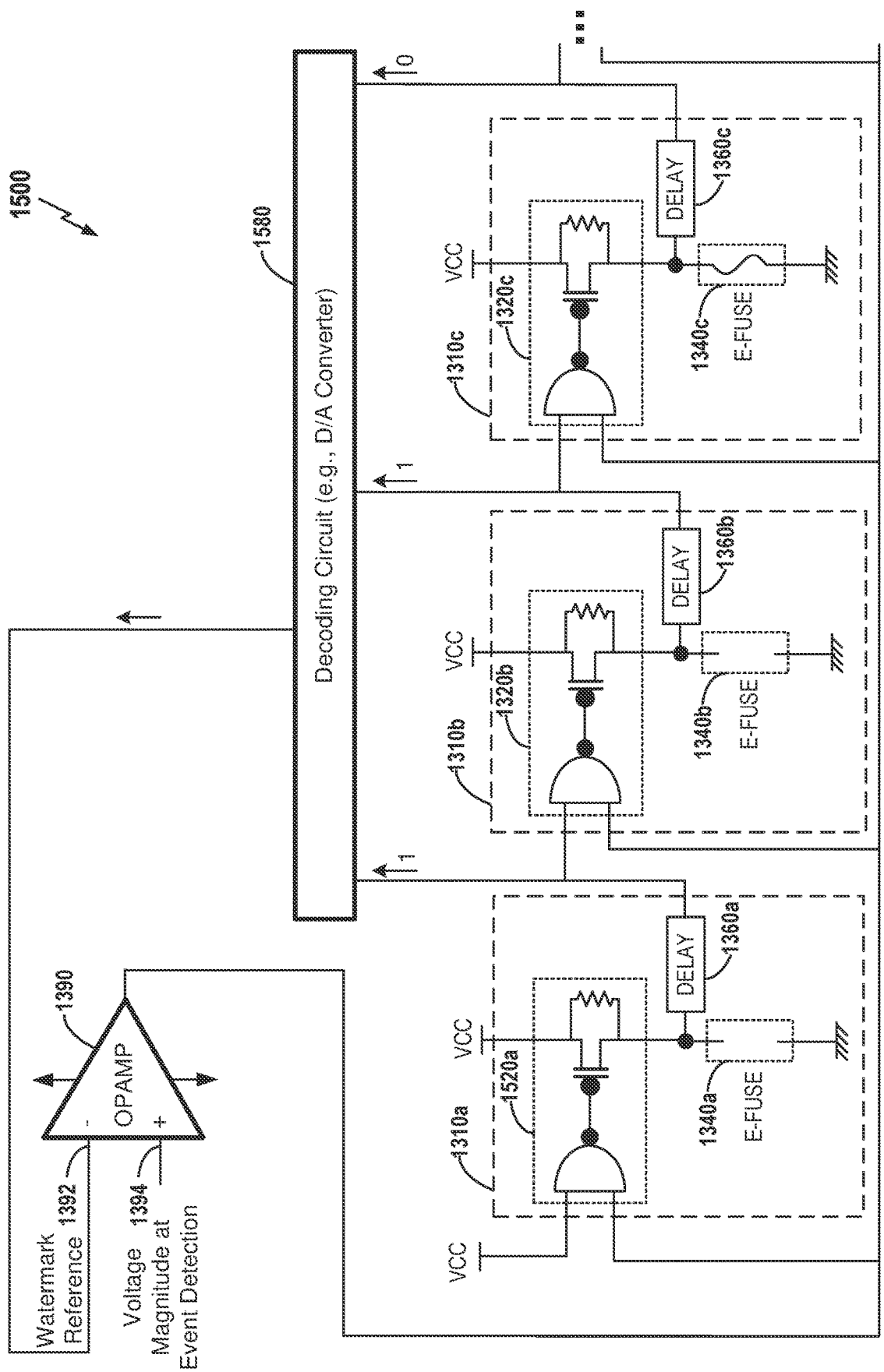
FIG. 15 is an example diagram illustrating the apparatus of FIGS. 13-14 when a first e-fuse of a first stage and a second e-fuse of a second stage are disconnected, according to some aspects.

FIG. 15 is an example diagram 1500 illustrating the apparatus of FIGS. 13 and 14 when a first e-fuse of a first stage and a second e-fuse of a second stage are disconnected, according to some aspects. FIG. 15 shows an example that occurs after the example shown in FIG. 14.

When the first signal from the example shown in FIG. 14 is provided to the M stages as the event detector signal, the first signal may cause the second e-fuse 1440b to disconnect, and thereby causing the second delay component 1460b to output a high signal (e.g., 1) after the time delay. In the example shown in FIG. 15, the decoder circuit 1380 may determine that the number of disconnected e-fuses is 2, and thus may convert the 2 disconnected e-fuse to the apparatus voltage magnitude of 2 V, which is provided to a watermark input 1392 of the magnitude comparison circuit 1390 as the watermark reference. Because the detected maximum voltage magnitude of 2V does not exceed the apparatus voltage magnitude of 2 V, the magnitude comparison circuit 1390 may output the second signal as the event detector signal, where the second signal does not cause any additional e-fuse to disconnect.

In an example, if the event detector detects a subsequent failure event and the detected maximum voltage magnitude of the subsequent failure event is 1 V, then detected maximum voltage magnitude of the subsequent failure event is less than or equal to the apparatus voltage magnitude of 2 V, and thus the magnitude comparison circuit 1390 outputs the second signal as the event detector signal, which does not cause any additional e-fuse to disconnect. Because the apparatus voltage magnitude is now 2 V, if the detected maximum voltage magnitude of the subsequent failure event is less than or equal to 2 V, no additional e-fuse may disconnect. If the detected maximum voltage magnitude of the subsequent failure event exceeds 2 V, then the magnitude comparison circuit 1390 outputs the first signal as the event detector signal, to cause an additional e-fuse to disconnect.

In some aspects, the apparatus for performing failure analysis may further include a voltage capture circuit configured to detect a maximum voltage magnitude during each failure event, a converter component configured to convert the detected maximum voltage magnitude to a maximum digital magnitude value, and a digital value comparison component. The digital value comparison component may compare an apparatus digital value based on a count of a number of disconnected e-fuses from the M stages and the maximum digital magnitude value. If the maximum digital magnitude value exceeds the apparatus digital value, then the digital value comparison component may output a first signal as the event detector signal to the M stages to cause an e-fuse of one of the M stages to disconnect. If the maximum digital magnitude value is less than or equal to the apparatus digital value, then the digital value comparison component may output a second signal, different from the first signal, as the event detector signal to the M stages.

For example, the digital value comparison component may be connected to each of the M stages and may determine a apparatus digital value comprised of high or low values respectively from the M stages. Each disconnected e-fuse may represent a high value (e.g., 1) and each connected e-fuse may represent the low value (e.g., 0). Hence, if the decoder circuit determines that the number of disconnected e-fuses is 2, then the digital value the decoder circuit may be 011 if three stages are considered, and this apparatus digital value of 011 is provided to the digital value comparison component. Also, when the event detector detects a failure event, then a maximum voltage magnitude during the failure event is detected and converted to a maximum digital magnitude value (e.g., by the converter component). The maximum digital magnitude value is sent to the digital value comparison component. If the detected maximum voltage magnitude is 3 V and is converted to the maximum digital magnitude value of 111, the maximum digital magnitude value of 111 exceeds the previous digital magnitude value of 011 and thus the magnitude comparison circuit may output the first signal to disconnect an additional e-fuse. This increases the number of the disconnected e-fuses to 3, and thus the previous digital magnitude value becomes 111, which is provided to the digital value comparison component. Now, the maximum digital magnitude value of 111 no longer exceeds the previous digital magnitude value of 111, and thus the digital value comparison circuit outputs the second signal to stop disconnecting any other e-fuses. Therefore, the digital value comparison circuit continues to send the first signal until the previous digital magnitude value reaches the maximum digital magnitude value.

Figure 16:
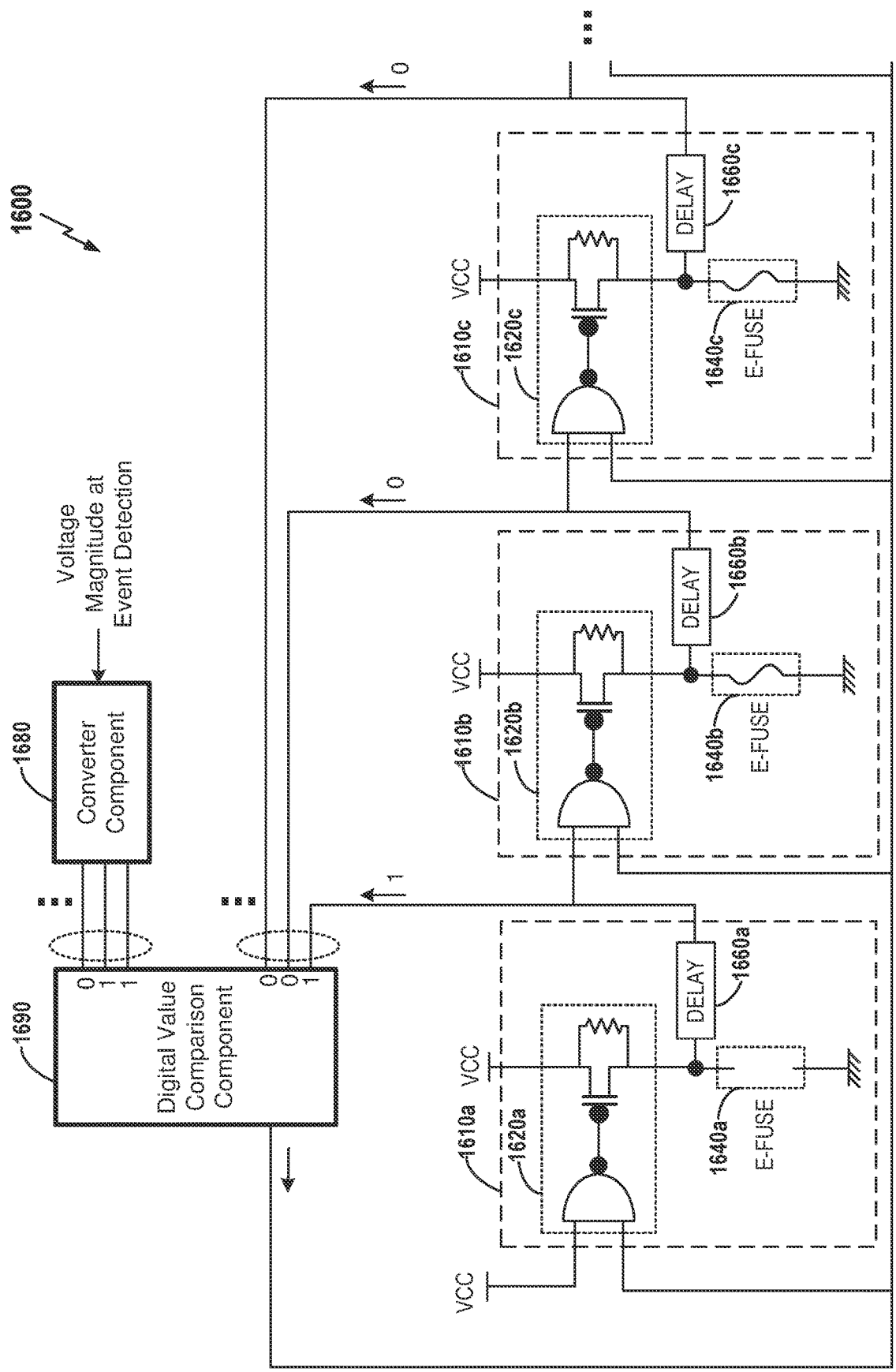
FIG. 16 is an example diagram illustrating an apparatus for performing failure analysis including multiple stages of the failure event counting circuit and further including a digital value comparison circuit, when a first e-fuse of a first stage is disconnected, according to some aspects.

FIG. 16 is an example diagram 1600 illustrating an apparatus for performing failure analysis including multiple stages of the failure event counting circuit and further including a digital value comparison circuit, when a first e-fuse of a first stage is disconnected, according to some aspects. As shown in FIG. 16, the apparatus for performing failure analysis may include multiple stages of the failure event counting circuit. FIG. 16 shows the first three stages of the multiple stages as an example. In particular, a first stage 1610a may include a first fuse trigger component 1620a, a first e-fuse 1640a, and a first delay component 1660a. A second stage 1610b may include a second fuse trigger component 1620b, a second e-fuse 1640b, and a second delay component 1660b. A third stage 1610c may include a third fuse trigger component 1620c, a third e-fuse 1640c, and a third delay component 1660c. The first stage 1610a, the second stage 1610b, and the third stage 1610c each may have components similar to the components of the $N^{th}$ stage 410 of FIG. 4, and thus the details of the components of the first stage 1610a, the second stage 1610b, and the third stage 1610c are omitted for brevity.

A converter component 1680 (e.g., analog-to-digital converter) may receive a detected maximum voltage magnitude during a failure event detected by the event detector and convert the detected maximum voltage magnitude to a maximum digital magnitude value. The maximum voltage magnitude may be detected by a voltage capture circuit, which may be a part of the apparatus for performing failure analysis or may exist separately from the apparatus for performing failure analysis. In an example, the converter component 1680 may be set such that 1 V represents a digital value of 1. Hence, in this example, if the converter component 1680 receives the detected maximum voltage magnitude of 2 V, then the converter component may convert 2 V to the maximum digital magnitude value of 011.

A digital value comparison component 1690 may be connected to each stage and determine a apparatus digital value based on a count of a number of disconnected e-fuses from the M stages. As shown in FIG. 16, the digital value comparison component 1690 may be connected to output nodes of the delay components of the M stages, including the first delay component 1660a, the second delay component 1660b, and the third delay component 1660c. If an e-fuse of a particular stage remains connected, the output of a respective fuse trigger component provides a low signal (e.g., 0), and thus an output of a respective delay component provides a low signal (e.g., 0). If an e-fuse of a particular stage disconnects, the output of a respective fuse trigger component provides a high signal (e.g., 1), and thus an output of a respective delay component provides a high signal (e.g., 1) with a time delay. In FIG. 16, only one e-fuse (e.g., the first e-fuse 1640a) is disconnected, and thus the digital value comparison component 1690 may determine that the apparatus digital value is 001. In some aspects, in the example of FIG. 16, the apparatus digital value of 001 may represent a maximum voltage magnitude of a previous failure event. By counting a number of the high signal, the digital value comparison component 1690 may generate the apparatus digital value.

The digital magnitude comparison circuit 1690 may compare the maximum digital magnitude value and the apparatus digital value. If the maximum digital magnitude value exceeds the apparatus digital value, the digital magnitude comparison circuit 1690 may output a first signal (e.g., 1) as the event detector signal to the M stages, to cause an e-fuse of one of the M stages to disconnect. On the other hand, if the maximum digital magnitude value is less than or equal to the apparatus digital value, the digital magnitude comparison circuit 1690 may output a second signal (e.g., 0) as the event detector signal to the M stages, where the second signal is different from the first signal. For example, the second signal may not disconnect any connected e-fuses.

In the example shown in FIG. 16, if the maximum digital magnitude value is 011, the digital magnitude comparison circuit 1690 may output the first signal as the event detector signal, because the maximum digital magnitude value of 011 exceeds the apparatus digital value of 001.

Figure 17:
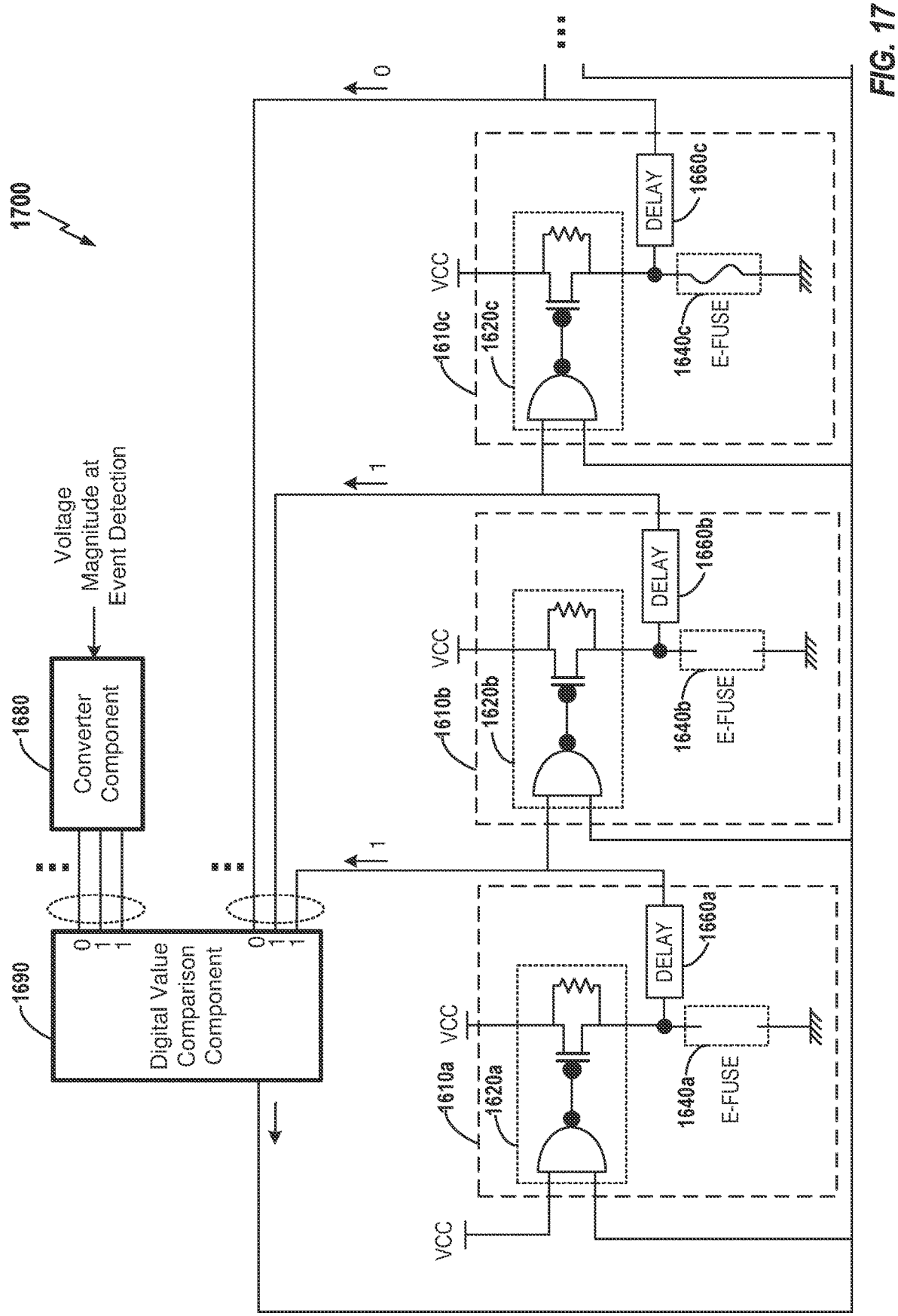
FIG. 17 is an example diagram illustrating the apparatus of FIG. 16 when a first e-fuse of a first stage and a second e-fuse of a second stage are disconnected, according to some aspects.

FIG. 17 is an example diagram 1700 illustrating the apparatus of FIG. 16 when a first e-fuse of a first stage and a second e-fuse of a second stage are disconnected, according to some aspects. FIG. 17 shows an example that occurs after the example shown in FIG. 16.

When the first signal (e.g., 1) from the example shown in FIG. 16 is provided to the M stages as the event detector signal, the first signal may cause the second e-fuse 1640*b* to disconnect, and thereby causing the second delay component 1660*b* to output a high signal (e.g., 1) after the time delay. In FIG. 17, two e-fuses including the first e-fuse 1640*a* and the second e-fuse 1640*b* are disconnected, and thus the digital value comparison component 1690 may determine that the apparatus digital value is 011. Because the maximum digital magnitude value of 011 is equal to the apparatus digital value of 011, the digital magnitude comparison component 1690 may output the second signal as the event detector signal, where the second signal does not cause any additional e-fuse to disconnect.

Figure 18:
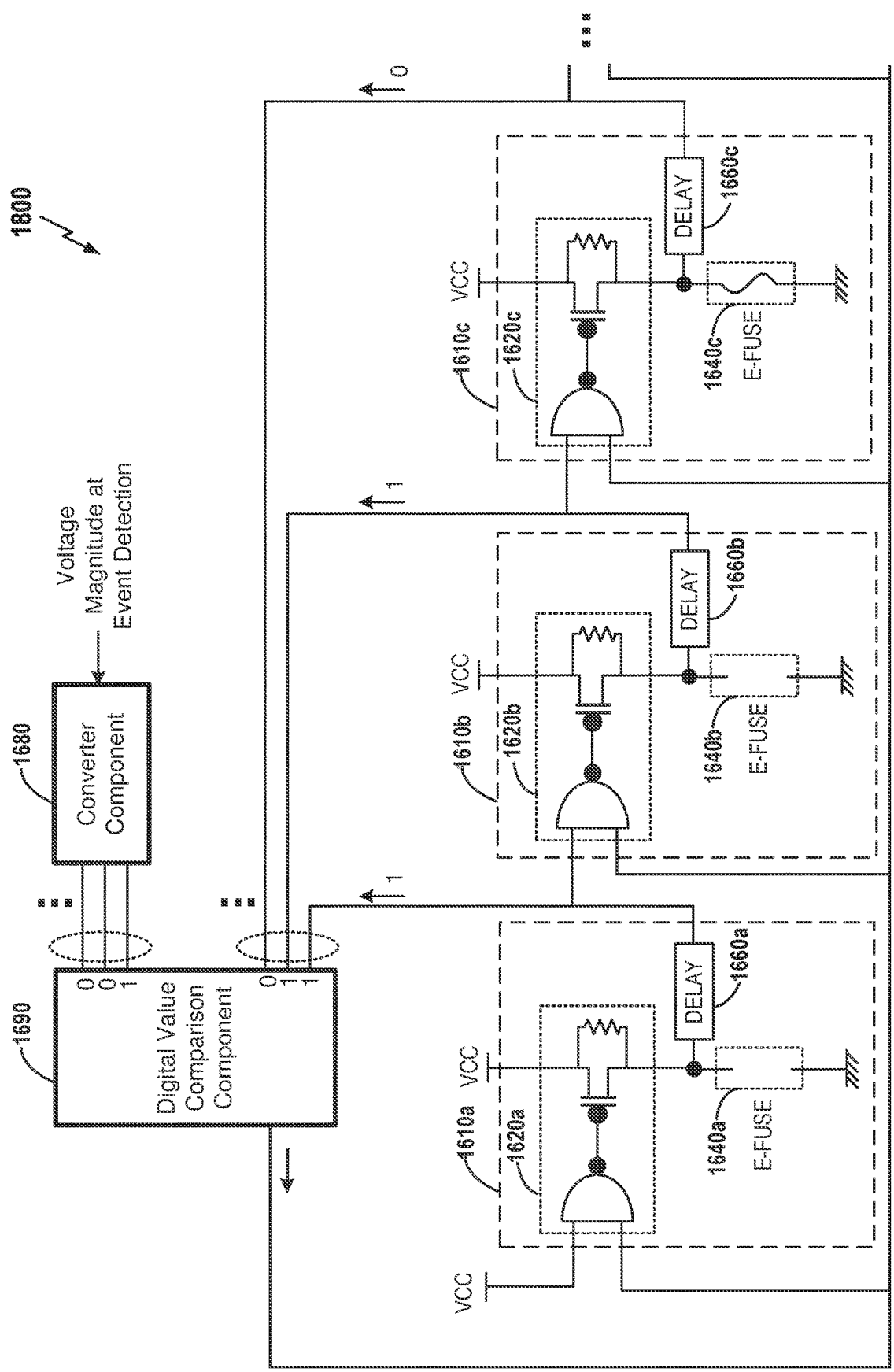
FIG. 18 is an example diagram illustrating the apparatus of FIGS. 16-17 when a first e-fuse of a first stage and a second e-fuse of a second stage are disconnected, according to some aspects.

FIG. 18 is an example diagram 1800 illustrating the apparatus of FIGS. 16 and 17 when a first e-fuse of a first stage and a second e-fuse of a second stage are disconnected, according to some aspects. In an example, the example in FIG. 18 may occur after the example shown in FIG. 17.

In FIG. 18, sometime after the failure event detected in FIGS. 16 and 17, a subsequent failure event is detected. The voltage capture circuit detects a maximum voltage magnitude of 1 V during the subsequent failure event. The converter circuit 1680 may convert the detected maximum voltage magnitude of 1 V to a maximum digital magnitude value of 001, and provide 001 to the digital value comparison component 1690. In FIG. 17, because two e-fuses including the first e-fuse 1640*a* and the second e-fuse 1640*b* are disconnected, the digital value comparison component 1690 may determine that the apparatus digital value is 011. Because the maximum digital magnitude value of 001 is less than the apparatus digital value of 011, the digital magnitude comparison component 1690 may output the second signal as the event detector signal, where the second signal does not cause any additional e-fuse to disconnect.

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. An apparatus, comprising:
   a plurality of stages of a failure event counting circuit comprising an $N^{th}$ stage where N refers to an arbitrary stage of the plurality of stages of the failure event counting circuit, the $N^{th}$ stage comprising:
   an $N^{th}$ fuse trigger circuit configured to receive an event detector signal indicative of a failure event;
   an $N^{th}$ electronic fuse (e-fuse) configured to disconnect a circuit path between a voltage source and a ground in response to the event detector signal; and
   an $N^{th}$ delay circuit coupled to the $N^{th}$ e-fuse and configured to cause a time delay for activating a subsequent stage of the failure event counting circuit in response to the $N^{th}$ e-fuse disconnecting,
   wherein each of the stages of the failure event counting circuit is configured to use the respective e-fuse to record a discrete failure event.

2. The apparatus of claim 1, wherein the $N^{th}$ fuse trigger circuit is further configured to receive an $N^{th}$ stage activation signal for activating the $N^{th}$ stage,
   wherein the $N^{th}$ fuse trigger circuit is configured to allow a fusing current to flow to the $N^{th}$ e-fuse in response to the event detector signal and the $N^{th}$ stage activation signal, and
   wherein the $N^{th}$ delay circuit is configured to cause the time delay to generate a subsequent stage activation signal for activating the subsequent stage after the time delay in response to the $N^{th}$ e-fuse disconnecting.

3. The apparatus of claim 1, further comprising:
   a final stage of the failure event counting circuit connected to a last stage of the plurality of stages of the failure event counting circuit, the final stage comprising:
   a final fuse trigger circuit to receive a final event detector signal indicative of a final failure event, and
   a final e-fuse configured to disconnect in response to the final event detector signal.

4. The apparatus of claim 3, wherein the final fuse trigger circuit is further configured to receive, from the last stage, a final stage activation signal for activating the final stage, and wherein the final fuse trigger circuit is configured to allow a fusing current to flow to the final e-fuse in response to the final event detector signal and the final stage activation signal.

5. The apparatus of claim 1, wherein the time delay applied by the $N^{th}$ delay circuit is associated with a type of the failure event, the type of the failure event characterizing at least one of a shape of the event detector signal or a magnitude of the event detector signal.

6. The apparatus of claim 5, wherein the time delay is greater than a pulse duration of the event.

7. The apparatus of claim 1, wherein the time delay is greater than a time it takes to disconnect the $N^{th}$ e-fuse.

8. The apparatus of claim 1, wherein the $N^{th}$ delay circuit comprises a resistor and a capacitor arranged in series, and wherein an input into the $N^{th}$ delay circuit is connected to the resistor at a node not shared with the capacitor, and an output from the $N^{th}$ delay circuit is connected to a common node shared by the resistor and the capacitor.

9. The apparatus of claim 1, further comprising:
a counter circuit configured to generate a count of a number of e-fuses from the plurality of stages that have disconnected in response to one or more failure events, wherein an output node of the $N^{th}$ delay circuit from the $N^{th}$ stage is connected to the counter circuit to indicate to the counter circuit that the $N^{th}$ e-fuse has disconnected.

10. The apparatus of claim 9, wherein the counter circuit comprises at least one of a scan chain circuit or a status register circuit.

11. The apparatus of claim 1, wherein an $N^{th}$ stage of the plurality of stages of the failure event counting circuit further comprises:
an $N^{th}$ light emitting circuit connected to the $N^{th}$ e-fuse and configured to illuminate in response to the $N^{th}$ e-fuse disconnecting.

12. The apparatus of claim 1, wherein the $N^{th}$ fuse trigger circuit comprises at least one of a NAND gate configured to receive the event detector signal or a NOR gate configured to receive the event detector signal.

13. The apparatus of claim 1, wherein the time delay applied by the $N^{th}$ delay circuit is adjustable.

14. The apparatus of claim 1, wherein the apparatus further comprises:
a latch circuit including a set/reset (SR) latch and connected to the $N^{th}$ fuse trigger circuit to prevent the event detector signal from entering the subsequent stage of the plurality of stages.

15. The apparatus of claim 1, further comprising:
a voltage capture circuit configured to detect a maximum voltage magnitude during each failure event;
a decoder circuit configured to convert a count of a number of disconnected e-fuses in the plurality stages to an apparatus voltage magnitude; and
a magnitude comparison circuit configured to:
compare the detected maximum voltage magnitude and the apparatus voltage magnitude based on the number of disconnected e-fuses,
output a first signal as the event detector signal to the plurality of stages in response to the detected maximum voltage magnitude exceeding the apparatus voltage magnitude to cause an e-fuse of one of the plurality of stages to disconnect, and
output a second signal, different from the first signal, as the event detector signal to the plurality of stages in response to the detected maximum voltage magnitude being less than or equal to the apparatus voltage magnitude.

16. The apparatus of claim 1, further comprising:
a voltage capture circuit configured to detect a maximum voltage magnitude during each failure event;
a converter circuit configured to convert the detected maximum voltage magnitude to a maximum digital magnitude value; and
a digital value comparison circuit configured to:
compare an apparatus digital value based on a count of a number of disconnected e-fuses from the plurality of stages and the maximum digital magnitude value,
output a first signal as the event detector signal to the plurality of stages in response to a current digital magnitude value exceeding the apparatus digital value to cause an e-fuse of one of the plurality of stages to disconnect, and
output a second signal, different from the first signal, as the event detector signal to the plurality of stages in response to the current digital magnitude value being less than or equal to the apparatus digital value.

17. The apparatus of claim 1, wherein the $N^{th}$ fuse trigger circuit, the $N^{th}$ e-fuse, and the $N^{th}$ delay circuit are connected to one another.

18. An apparatus, comprising:
a plurality of stages of a failure event counting circuit comprising an $N^{th}$ stage where N refers to an arbitrary stage of the plurality of stages of the failure event counting circuit, the $N^{th}$ stage comprising:
an $N^{th}$ fuse trigger circuit configured to receive an event detector signal indicative of a failure event;
an $N^{th}$ electronic fuse (e-fuse) configured to disconnect a circuit path between a voltage source and a ground in response to the event detector signal; and
an $N^{th}$ delay circuit coupled to the $N^{th}$ e-fuse and configured to cause a time delay for activating a subsequent stage of the failure event counting circuit in response to the $N^{th}$ e-fuse disconnecting,
wherein each of the stages of the failure event counting circuit is configured to use the respective e-fuse to record a discrete failure event; and
a final stage of the failure event counting circuit connected to a last stage of the plurality of stages of the failure event counting circuit, the final stage comprising:
a final fuse trigger circuit to receive a final event detector signal indicative of a final failure event, and
a final e-fuse configured to disconnect in response to the final event detector signal.

19. The apparatus of claim 18, wherein the $N^{th}$ fuse trigger circuit is further configured to receive an $N^{th}$ stage activation signal for activating the $N^{th}$ stage,
wherein the $N^{th}$ fuse trigger circuit is configured to allow a fusing current to flow to the $N^{th}$ e-fuse in response to the event detector signal and the $N^{th}$ stage activation signal, and
wherein the $N^{th}$ delay circuit is configured to cause the time delay to generate a subsequent stage activation signal for activating the subsequent stage after the time delay in response to the $N^{th}$ e-fuse disconnecting.

* * * * *